(12) United States Patent
Ishiyama

(10) Patent No.: US 7,006,070 B2
(45) Date of Patent: Feb. 28, 2006

(54) OPERATIONAL AMPLIFIER CIRCUIT, DRIVING CIRCUIT, AND DRIVING METHOD

(75) Inventor: Hisanobu Ishiyama, Chino (JP)

(73) Assignee: Seiko Epson Corporation, Tokyo (JP)

( * ) Notice: Subject to any disclaimer, the term of this patent is extended or adjusted under 35 U.S.C. 154(b) by 348 days.

(21) Appl. No.: 10/155,972

(22) Filed: May 29, 2002

(65) Prior Publication Data
US 2002/0180717 A1 Dec. 5, 2002

(30) Foreign Application Priority Data
Jun. 4, 2001 (JP) ........................ 2001-168519

(51) Int. Cl.
*G09G 3/36* (2006.01)
*H03G 3/30* (2006.01)

(52) U.S. Cl. .................. 345/100; 345/87; 330/282
(58) Field of Classification Search .......... 345/87, 345/96, 98–100, 204; 330/282, 291
See application file for complete search history.

(56) References Cited

U.S. PATENT DOCUMENTS

| 4,906,984 | A |   | 3/1990  | Takeda et al. |
| 5,059,921 | A |   | 10/1991 | Vyne et al. |
| 5,361,041 | A | * | 11/1994 | Lish ............... 330/255 |
| 5,386,152 | A |   | 1/1995  | Naraki |
| 5,537,129 | A | * | 7/1996  | Okada et al. ........ 345/90 |
| 5,627,457 | A |   | 5/1997  | Ishiyama et al. |
| 5,850,139 | A | * | 12/1998 | Edwards ............. 323/280 |
| 5,852,426 | A | * | 12/1998 | Erhart et al. ........ 345/96 |
| 5,909,146 | A | * | 6/1999  | Okada ............... 330/255 |
| 6,052,025 | A |   | 4/2000  | Chang et al. |
| 6,172,663 | B1|   | 1/2001  | Okada et al. |
| 6,313,819 | B1| * | 11/2001 | Maekawa et al. ...... 345/92 |
| 6,373,456 | B1| * | 4/2002  | Matsubara .......... 345/94 |
| 6,433,765 | B1| * | 8/2002  | Fujiwara et al. ..... 345/87 |
| 6,567,066 | B1| * | 5/2003  | Hashimoto .......... 345/100 |
| 2002/0080934 | A1 |   | 6/2002 | Ishiyama |
| 2002/0180720 | A1 |   | 12/2002 | Ishiyama |

FOREIGN PATENT DOCUMENTS

| EP | 0 548 051 A2 | 6/1993 |
| EP | 0 711 033 A1 | 5/1996 |
| EP | 1 265 215 A2 | 12/2002 |
| EP | 1 265 217 A2 | 12/2002 |
| GB | 2 188 471 A  | 9/1987 |
| JP | 05-014064    | 1/1993 |
| JP | 05-23676     | 3/1993 |
| JP | 05-268029    | 10/1993 |
| JP | A 7-98577    | 4/1995 |

(Continued)

*Primary Examiner*—Regina Liang
*Assistant Examiner*—Duc Q Dinh
(74) *Attorney, Agent, or Firm*—Oliff & Berridge, PLC

(57) ABSTRACT

An output of an operational amplifier circuit is set to the high impedance state in a given period including a transition between a period T1 (positive polarity) in which a voltage level of a counter electrode VCOM becomes VC1 and a period T2 (negative polarity) in which VCOM becomes VC2. In the period T1, data line is driven by a P-type operational amplifier OP1 having a P-type driving transistor, while in the period T2, the data line is driven by an N-type operational amplifier OP2 having an N-type driving transistor. By positively using a parasitic capacitance between the counter electrode and the data line, the voltage level of the data line is changed before driving. The excess charge is returned to the power source side by clamping the output of the operational amplifier circuit to a voltage range equal to or wider than a voltage range of power sources VDD and VSS. The voltage range of power sources VDD' and VSS' of a clamp circuit are set to be narrower than that of the power sources VDD and VSS of the operational amplifier circuit.

12 Claims, 25 Drawing Sheets

OPERATIONAL AMPLIFIER CIRCUIT

FOREIGN PATENT DOCUMENTS

| | | |
|---|---|---|
| JP | A 7-281639 | 10/1995 |
| JP | 07-281640 | 10/1995 |
| JP | 09-230829 | 9/1997 |
| JP | 11-150430 | 6/1999 |
| JP | 11-259052 | 9/1999 |
| JP | 2000-029436 | 1/2000 |
| JP | 2001-004974 * | 1/2001 |

* cited by examiner

DATA LINE DRIVING CIRCUIT (SOURCE DRIVER)

FIG. 4

| METHOD | FRAME INVERSION | SCAN LINE INVERSION | DATA LINE INVERSION | DOT INVERSION |
|---|---|---|---|---|
|  | +++++++<br>+++++++<br>+++++++<br>+++++++<br>+++++++<br>+++++++<br>+++++++ | +++−−+++−−+++<br>+++−−+++−−+++<br>+++−−+++−−+++<br>+++−−+++−−+++<br>+++−−+++−−+++<br>+++−−+++−−+++ | ++++++<br>−−−−−−<br>++++++<br>−−−−−−<br>++++++<br>−−−−−− | +−+−+−<br>−+−+−+<br>+−+−+−<br>−+−+−+<br>+−+−+−<br>−+−+−+ |
| IMAGE QUALITY | ▲ | ○ | ○ | ◎ |
| CURRENT CONSUMPTION | ◎ | ○ | ▲ | ▲ |
| VOLTAGE | LOW VOLTAGE (VCOM INVERTED) | LOW VOLTAGE (VCOM INVERTED) | HIGH VOLTAGE (VCOM FIXED) | HIGH VOLTAGE (VCOM FIXED) |

OPERATIONAL AMPLIFIER CIRCUIT

OPERATIONAL AMPLIFIER CIRCUIT

FIG. 12A  STORAGE CAPACITANCE METHOD
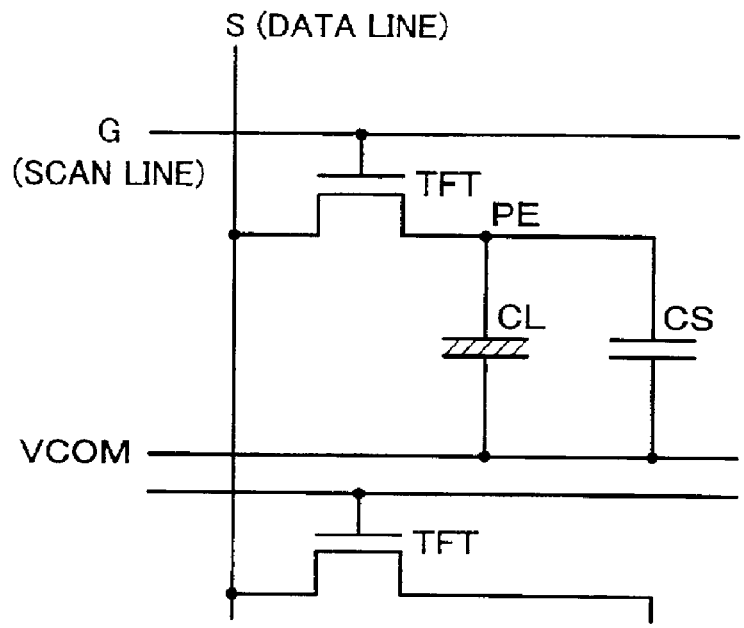
FIG. 12B  ADDITIONAL CAPACITANCE METHOD
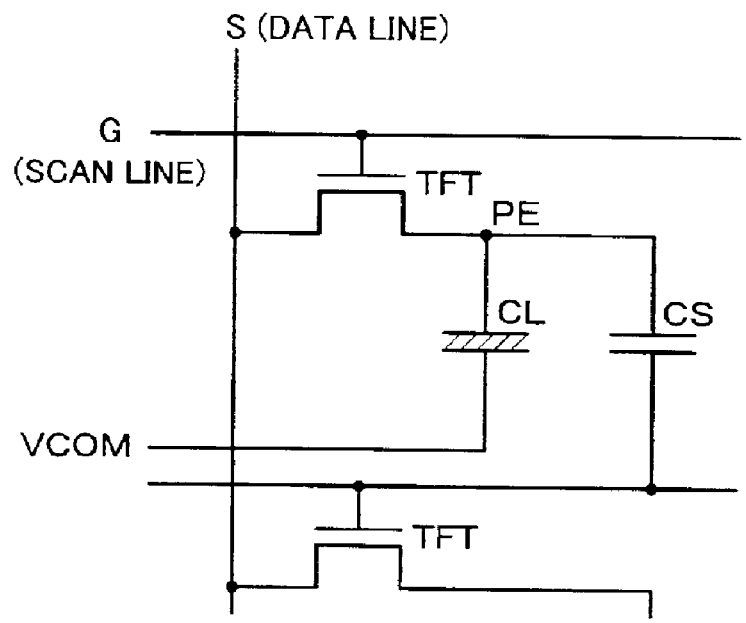

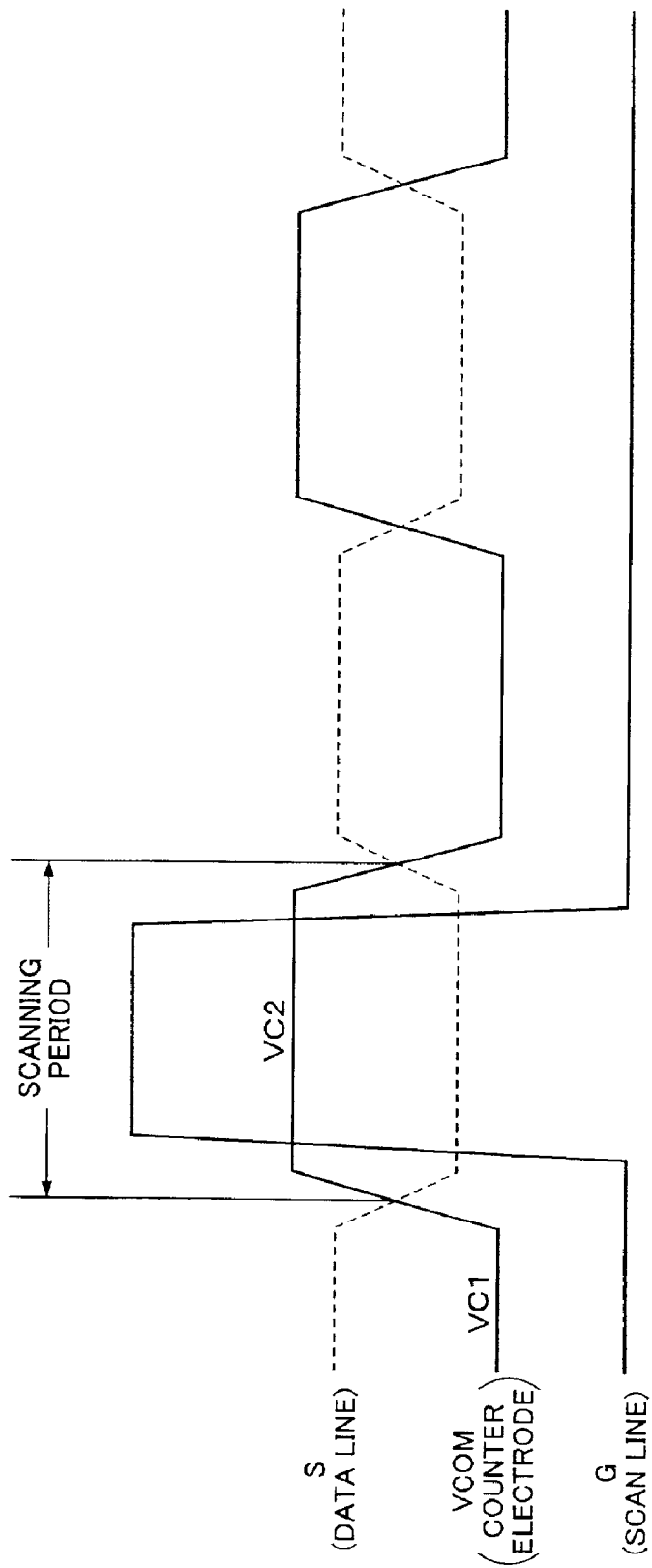

OPERATIONAL AMPLIFIER CIRCUIT, DRIVING CIRCUIT, AND DRIVING METHOD

Japanese patent application no. 2001-168519 filed on Jun. 4, 2001, is hereby incorporated by reference in its entirety.

BACKGROUND

The present invention relates to an operational amplifier circuit, a driving circuit and a driving method.

Conventionally, as a liquid crystal panel (electro-optical device) which is used for an electronic instrument such as a portable telephone, there have been known a passive matrix type liquid crystal panel and an active matrix type liquid crystal panel which uses switching elements such as thin film transistors (abbreviated as TFT hereinafter).

Although the passive matrix type is advantageous compared to the active matrix type in that the lowering of power consumption can be easily obtained, the passive matrix type has a disadvantage that the multi-colorization and the moving picture display are difficult. With respect to a technique for lowering the power consumption in the passive matrix type, there has been known a conventional technique disclosed in Japanese Laid-open Patent Publication 7-98577, for example.

On the other hand, although the active matrix type has an advantage that this type is suitable for the multi-colorization and the moving picture display, the active matrix type has a disadvantage that the lowering of the power consumption is difficult.

Recently, in the field of the portable type electronic instrument such as a portable telephone set, the demand for multi-colorization and moving picture display has been increasing to provide high quality images. Accordingly, in place of the passive matrix type liquid crystal panel which has been used heretofore, the active matrix type liquid crystal panel is now popularly used.

However, with respect to the active matrix type liquid crystal panel used for the portable type electronic instrument, to cope with the demand for the alternating current driving of the liquid crystal and the lowering of voltage of power sources, a voltage level of counter electrodes (common electrodes) which face pixel electrodes is inverted every scanning period, for example. Accordingly, due to the large charging/discharging of a liquid crystal panel and an operation current of an operational amplifier circuit which drives an analogue voltage, there has been a problem that the realization of the lowering of power consumption is hardly achieved.

SUMMARY

One aspect of the present invention relates to an operational amplifier circuit which drives each of data lines of an electro-optical device having scan lines, data lines and pixel electrodes which are specified by the scan lines and the data lines, wherein an output of the operational amplifier circuit is set to a high impedance state in a given period including a transition between a first period in which a voltage level of a counter electrode becomes a first voltage level and a second period in which the voltage level of the counter electrode becomes a second voltage level, the counter electrode facing a pixel electrode with an electro-optical material interposed therebetween.

BRIEF DESCRIPTION OF THE SEVERAL VIEWS OF THE DRAWING

FIG. 4 is an illustrative describing various types of inversion driving methods in the liquid crystal device;

FIG. 12A and FIG. 12B are diagrams describing a storage capacitance method and an additional capacitance method;

FIG. 13 is a timing waveform chart showing the change of voltage levels of the counter electrode, data line, and scan line;

DETAILED DESCRIPTION

Figure 1:
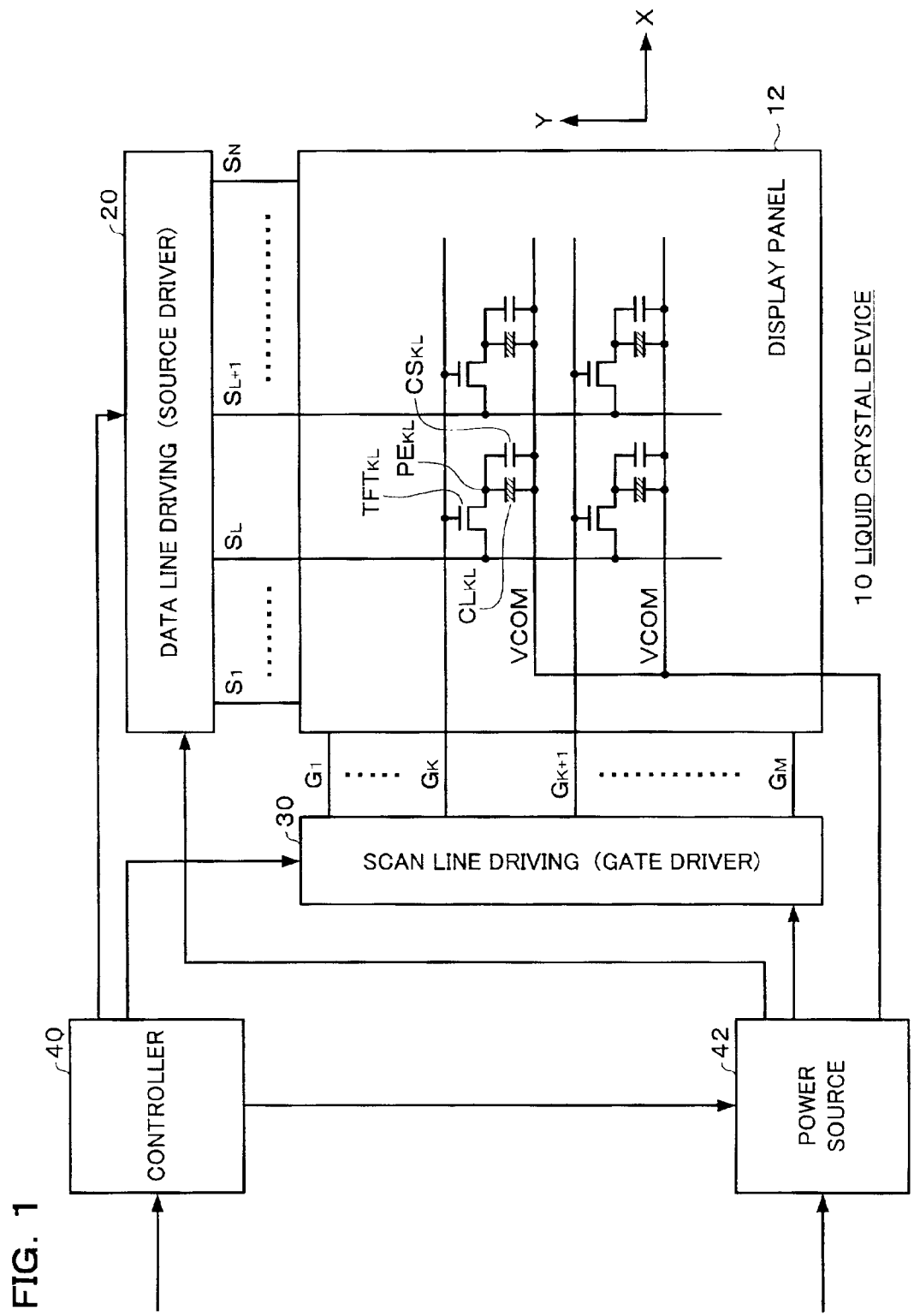
FIG. 1 is a block diagram showing an example of the configuration of a liquid crystal device.

Embodiments of the present invention are described hereinafter.

Note that the embodiments described hereunder do not in any way limit the scope of the invention defined by the claims laid out herein. Note also that all of the elements of these embodiments should not be taken as essential requirements to the means of the present invention.

The embodiments have been made in view of the above-mentioned technical problems, and according to the embodiments of the present invention, there are provided an operational amplifier circuit which can realize the reduction of power consumption of an electro-optical device using a simple circuit configuration and a driving circuit and a driving method using such an operational amplifier circuit.

One embodiment of the present invention provides an operational amplifier circuit which drives each of data lines of an electro-optical device having scan lines, data lines and pixel electrodes which are specified by the scan lines and the data lines, wherein an output of the operational amplifier circuit is set to a high impedance state in a given period including a transition between a first period in which a voltage level of a counter electrode becomes a first voltage level and a second period in which the voltage level of the counter electrode becomes a second voltage level, the counter electrode facing a pixel electrode with an electro-optical material interposed therebetween.

According to this embodiment, in the given period including the transition (the transition timing) between the first period and the second period in which the voltage level of the counter electrode becomes the first and the second voltage levels, the output of the operational amplifier circuit is set to the high impedance state (non-driving state). In this configuration, it is possible to change the voltage level of the data line to a desirable voltage level before driving the data line by effectively utilizing the parasitic capacitance between the counter electrode and the data line, and it is also possible to return the charge which flows into the output side of the operational amplifier circuit to the power source side due to the change of the voltage level of the counter electrode whereby the lowering of the power consumption can be realized.

The operational amplifier circuit may comprise:

a first operational amplifier which drives a data line in the first period in which a voltage level of the counter electrode becomes the first voltage level; and a second operational amplifier which drives the data line in the second period in which a voltage level of the counter electrode becomes the second voltage level.

In this configuration, the operational amplifier circuit can drive the data line using the optimum operational amplifier corresponding to the change (inversion of polarity) of the voltage level of the counter electrode, and the lowering of the power consumption can be realized.

In the operational amplifier circuit, the first operational amplifier may comprise:

a differential section; and an output section which has a first driving transistor of a first conductivity type having a gate electrode which is controlled based on an output of the differential section, and the second operational amplifier may comprise:

a differential section; and an output section which has a second driving transistor of a second conductivity type having a gate electrode which is controlled based on an output of the differential section.

In this configuration, the data line can be driven by the first driving transistor of the first conductivity type during the first period and can be driven by the second driving transistor of the second conductivity type during the second period. Accordingly, it is possible to drive the data line with the proper driving transistor so that the lowering of power consumption of the operational amplifier circuit can be realized.

In the operational amplifier circuit, a voltage level of a data line connected to an output of the operational amplifier circuit may be changed to a second power source side by setting an output of the operational amplifier circuit to the high impedance state and by using a capacitive coupling of a parasitic capacitance between the counter electrode and the data line, in a given period in which a voltage level of the counter electrode changes from a second voltage level of a first power source side to a first voltage level of a second power source side, and the voltage level of the data line connected to an output of the operational amplifier circuit may be changed to a first power source side by setting an output of the operational amplifier circuit to the high impedance state and by using the capacitive coupling of the parasitic capacitance between the counter electrode and the data line, in a given period in which a voltage level of the counter electrode changes from a first voltage level of a second power source side to a second voltage level of a first power source side.

In this configuration, it is possible to change the voltage level of the data line to a given direction (second power source side or the first power source side) before driving the data lines by effectively using the parasitic capacitance between the counter electrode and the data line. Accordingly, it is possible to determine the changing direction of the voltage level at the time of driving the data lines to one direction so that the lowering of the power consumption of the operational amplifier circuit can be realized.

The operational amplifier circuit may include:

a first operational amplifier which changes the voltage level of the data line which has been changed to the second power source side to the first power source side, and sets the voltage level of the data line to a voltage level corresponding to a gray scale level; and a second operational amplifier which changes the voltage level of the data line which has been changed to the first power source side to the second power source side, and sets the voltage level of the data line to a voltage level corresponding to a gray scale level.

In this configuration, as the first or the second operational amplifier, it is possible to use an operational amplifier having a high driving ability for only one of the first and the second power source sides so that an operational amplifier which exhibits a small power consumption can be used. Accordingly, the power consumption of the operational amplifier can be lowered.

The operational amplifier circuit may include a clamp circuit which clamps an output of the operational amplifier circuit in a voltage range which is equal to or wider than a voltage range between first and second power sources of the operational amplifier circuits.

In this configuration, it is possible to return the charge which flows into the output side of the operational amplifier circuit due to the change of the voltage level of the counter electrode to the power source side so that the excessive charge can be effectively utilized.

In the operational amplifier circuit, a power source of the clamp circuit may be set to third and fourth power sources which have voltage ranges narrower than voltage ranges of the first and second power sources of the operational amplifier circuit.

In this configuration, it is possible to increase a quantity of charge returning to the power source side so that the further lowering of the power consumption can be realized.

Another embodiment of the present invention provides a driving circuit which drives an electro-optical device having scan lines, data lines and pixel electrodes which are specified by the scan lines and the data lines, the driving circuit comprising;

any one of the above operational amplifier circuits, which is provided for each of the data lines; and a data voltage generation circuit which is provided for each of the data lines and generates a data voltage which is impedance-converted by the operational amplifier circuit.

A further embodiment provides a method of driving an electro-optical device having scan lines, data lines and pixel electrodes which are specified by the scan lines and the data lines, the method comprising:

setting a data line to a high impedance state in a given period including a transition between a first period in which a voltage level of a counter electrode becomes a first voltage level and a second period in which the voltage level of the counter electrode becomes a second voltage level, the counter electrode facing a pixel electrode with an electro-optical material interposed therebetween.

The driving method may further comprise:

changing a voltage level of a data line to a second power source side by setting the data line to the high impedance state and by using a capacitive coupling of a parasitic capacitance between the counter electrode and the data line, in a given period in which a voltage level of the counter electrode changes from a second voltage level of a first power source side to a first voltage level of a second power source side; and changing the voltage level of the data line to a first power source side by setting the data line to the high impedance state and by using the capacitive coupling of the parasitic capacitance between the counter electrode and the data line, in a given period in which a voltage level of the counter electrode changes from a first voltage level of a second power source side to a second voltage level of a first power source side.

The driving method may comprise:

changing the voltage level of the data line which has been changed to the second power source side to the first power source side, and setting the voltage level of the data line to a voltage level corresponding to a gray scale level; and changing the voltage level of the data line which has been changed to the first power source side to the second power source side, and setting the voltage level of the data line to a voltage level corresponding to a gray scale level.

The driving method may comprise:

clamping the voltage level of the data line to a voltage range which is equal to or wider than a voltage range between first and second power sources.

Hereinafter, the embodiments of the present invention are described in further detail in conjunction with attached drawings.

1. Liquid Crystal Device

FIG. 1 is a block diagram showing an example of a liquid crystal device to which an operational amplifier circuit of this embodiment is applied.

The liquid crystal device 10 (display device in a broad sense) includes a display panel 12 (LCD (Liquid Crystal Display) panel in a narrow sense), a data line driving circuit 20 (a source driver in a narrow sense), a scan line driving circuit 30 (gate driver in a narrow sense), a controller 40 and a power source circuit 42. Here, the liquid crystal device 10 is not always required to include all of these circuit blocks and some circuit blocks may be omitted.

Here, the display panel 12 (electro-optical device in a broad sense) includes a plurality of scan lines (gate lines in a narrow sense), a plurality of data lines (source lines in a narrow sense) and pixel electrodes which are specified by the scan lines and the data lines. Here, thin film transistors (TFTs, switching elements in a broad sense) are connected to the data lines and the pixel electrodes are connected to the TFTs thus constituting an active matrix type liquid crystal device.

More specifically, the display panel 12 is formed as an active matrix substrate (glass substrate, for example). On this active matrix substrate, a plurality of scan lines $G_1$ to $G_M$ (M being a natural number of 2 or more) which are arranged in parallel in the Y direction in FIG. 1 and are respectively extended in the X direction in FIG. 1 and a plurality of data lines $S_1$ to $S_N$ (N being a natural number of 2 or more) which are arranged in parallel in the X direction in FIG. 1 and are respectively extended in the Y direction in FIG. 1 are arranged. Further, at a position corresponding to a crossing point of the scan line $G_K$ ($1 \leq K \leq M$, K being a natural number) and the data line $S_L$ ($1 \leq L \leq N$, L being a natural number), a $TFT_{KL}$ (switching element in a broad sense) is provided.

A gate electrode of the $TFT_{KL}$ is connected to the scan line $G_K$, a source electrode of the $TFT_{KL}$ is connected to the data line $S_L$, and a drain electrode of the $TFT_{KL}$ is connected to the pixel electrode $PE_{KL}$. Between pixel electrode $PE_{KL}$ and a counter electrode VCOM (common electrode) which faces the pixel electrode $PE_{KL}$ with a liquid crystal element (electro-optical material in a broad sense) interposed therebetween, liquid crystal capacitance $CL_{KL}$ (liquid crystal element) and auxiliary capacitance $CS_{KL}$ are generated. Further, liquid crystal is filled between the active matrix substrate on which the $TFT_{KL}$, pixel electrodes $PE_{KL}$ and the like are formed and a counter substrate on which the counter electrode VCOM is formed. The transmittance of the liquid crystal element is changed in response to a voltage applied between the pixel electrode $PE_{KL}$ and the counter electrode VCOM.

Here, the voltage levels (first and second voltage levels) applied to the counter electrode VCOM are generated by the power source circuit 42. Further, without forming the counter electrode VCOM in a matted manner on the counter substrate, it is possible to form counter electrodes VCOM in a strip shape such that they correspond to respective scan lines.

The data line driving circuit 20 drives the data lines $S_1$ to $S_N$ of the display panel 12 based on the image data. On the other hand, the scan line driving circuit 30 sequentially performs the scanning driving of the scan lines $G_1$ to $G_M$ of the display panel 12.

The controller 40 controls the data line driving circuit 20, the scan line driving circuit 30 and the power source circuit 42 in accordance with a content set by a host computer such as a central processing unit (hereinafter referred to as "CPU") not shown in the drawing. More specifically, the controller 40 performs the setting of operational modes and supplies vertical synchronous signals and horizontal synchronous signals which are generated in the inside of the controller 40 to the data line driving circuit 20 and the scan line driving circuit 30, while the controller 40 performs the control of polarity inversion timing of voltage level of the counter electrode VCOM.

The power source circuit 42 generates various types of voltage levels (gray scale voltages) and the voltage level of the counter electrode VCOM necessary for driving the display panel 12 based on reference voltages supplied from the outside.

In the liquid crystal device 10 having such a configuration, under the control of the controller 40, based on the image data supplied from the outside, the data line driving circuit 20, the scan line driving circuit 30 and the power source circuit 42 drive the display panel 12 in a cooperative manner.

Here, in FIG. 1, although the liquid crystal device 10 is configured to incorporate the controller 40 therein, the controller 40 may be provided outside the liquid crystal device 10. Alternately, a host computer may be incorporated into the liquid crystal device 10 together with the controller 40. Further, a portion of or all of the data line driving circuit 20, the scan line driving circuit 30, the controller 40 and the power source circuit 42 may be formed on the display panel 12.

1.1 Data Line Driving Circuit

Figure 2:
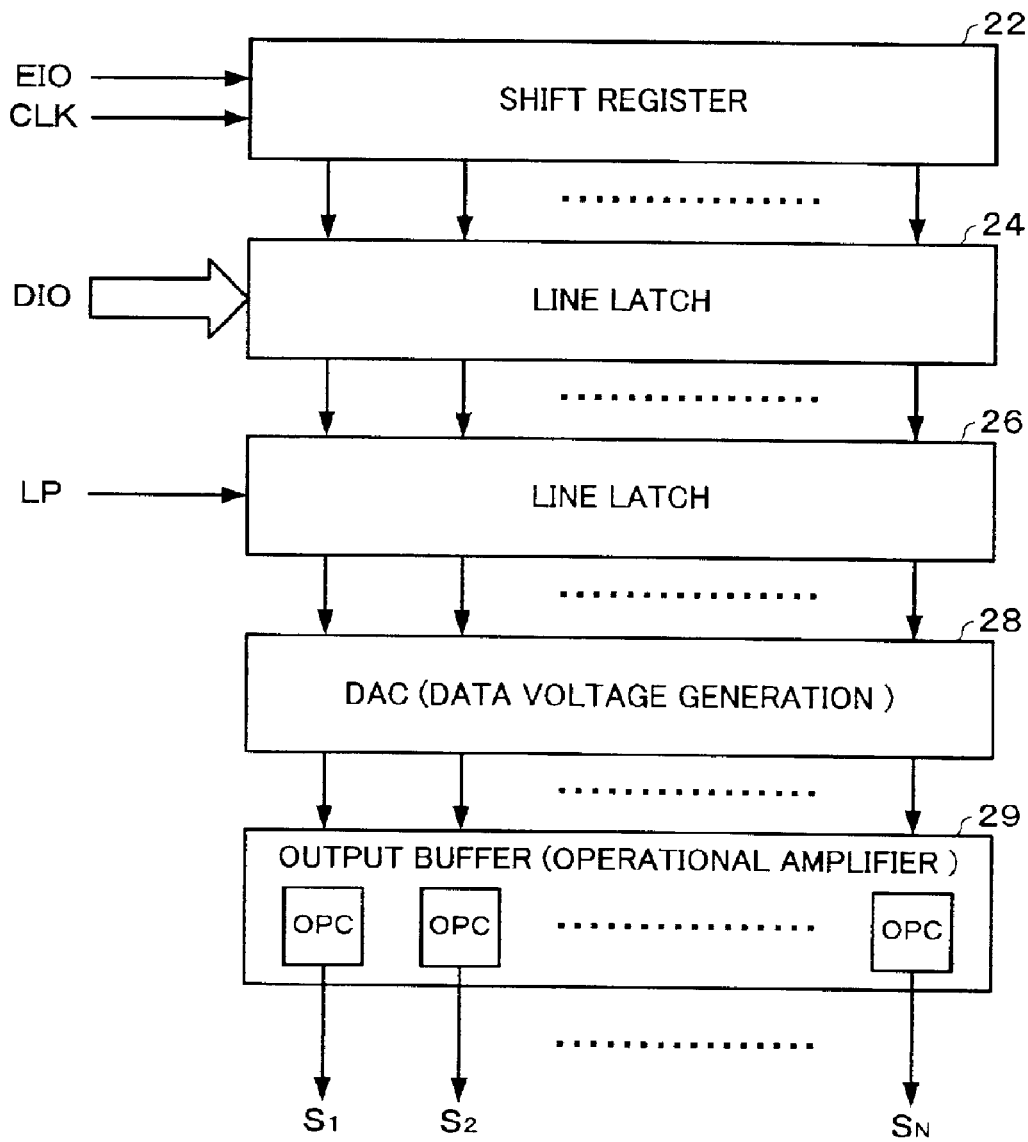
FIG. 2 is a block diagram showing an example of the configuration of a data line driving circuit.

FIG. 2 shows an example of the configuration of the data line driving circuit 20 shown in FIG. 1.

The data line driving circuit 20 includes a shift register 22, line latches 24, 26, a DAC 28 (digital/analogue conversion circuit, data voltage generation circuit in a broad sense), and an output buffer 29 (operational amplifier circuits).

The shift register 22 includes a plurality of flip-flops which are provided corresponding to respective data lines and are sequentially connected with each other. The shift register 22 holds enable input/output signals in synchronism with clock signals CLK and sequentially shifts the enable input/output signals EIO to neighboring flip-flops in synchronism with the clock signals CLK.

The image data (DIO) is inputted to the line latch 24 per a unit of 18 bits (6 bits (gray scale data)×3 (respective colors R, G, B)) from the controller 40, for example. The line latch 24 latches the image data (DIO) in synchronism with the enable input/output signals EIO which are sequentially shifted by respective flip-flops of the shift register 22.

The line latch 26 latches the image data for 1 horizontal scanning unit which is latched by the line latch 24 in synchronism with horizontal synchronous signals LP supplied from the controller 40.

The DAC 28 generates analogue data voltages to be supplied to respective data lines. More specifically, the DAC 28, based on digital image data from the line latch 26, selects any one of gray scale voltages from the power source circuit 42 shown in FIG. 1 and outputs the analogue data voltages corresponding to the digital image data.

The output buffer 29 outputs the data voltages from the DAC 28 to the data lines after buffering them and drives the data lines. More specifically, the output buffer 29 includes operational amplifier circuits OPC in voltage follower connection provided for respective data lines and these operational amplifier circuits OPC output the data voltages from the DAC 28 to respective data lines after performing the impedance conversion.

Here, in FIG. 2, the data line driving circuit is configured such that the data line driving circuit 20 is configured such that the digital image data is subjected to the digital/analogue conversion and the analogue data is outputted to the data lines through the output buffer 29. However, the analogue video signals may be subjected to a sample holding and may be outputted to the data lines through the output buffer 29.

1.2 Scan Line Driving Circuit

Figure 3:
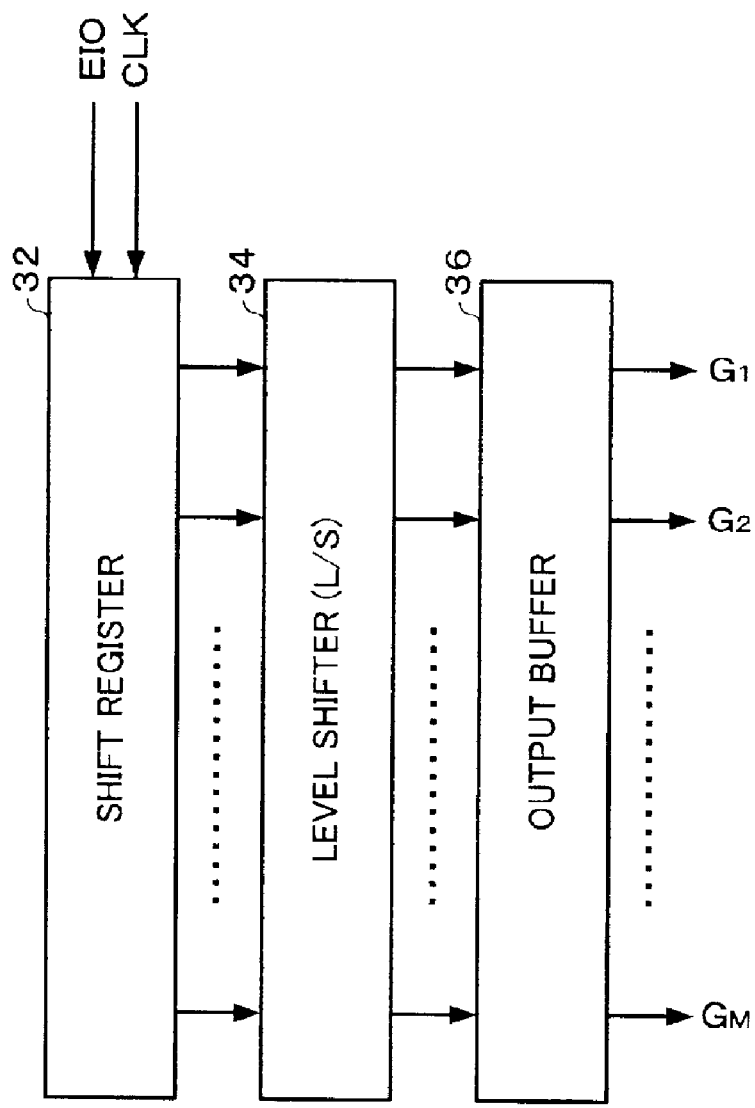
FIG. 3 is a block diagram showing an example of the configuration of a scan line driving circuit.

FIG. 3 shows an example of the configuration of the scan line driving circuit 30 shown in FIG. 1.

The scan line driving circuit 30 includes a shift register 32, a level shifter 34 and an output buffer 36.

The shift register 32 includes a plurality of flip-flops which are provided corresponding to respective scan lines and are sequentially connected to each other. The shift register 32, when enable input/output signals EIO are held by the flip-flops in synchronism with clock signals CLK, sequentially shifts the enable input/output signals EIO to neighboring flip-flops in synchronism with the clock signals CLK. Here, the inputted enable input/output signals EIO are vertical synchronous signals which are supplied from the controller 40.

The level shifter 34 shifts the voltage levels outputted from the shift register 32 to the voltage levels corresponding to the capacities of the liquid crystal element of the display panel 12 and the TFTs. The high voltage level of 20V to 50V, for example, is necessary as the voltage level and hence, the high dielectric strength process different from that of the other logic circuit parts is used. The output buffer 36 outputs the scanning voltage which is shifted by the level shifter 34 after buffering the scanning voltage and drives the scan lines.

2. Operational Amplifier Circuit 2.1 Line Inversion Driving

The liquid crystal element has a property that when the direct current voltage is applied to the liquid crystal element for a long time, the liquid crystal element is deteriorated. To prevent such deterioration, a driving method which inverts the polarity of the voltage applied to the liquid crystal element every given period become necessary. As such a driving method, there have been known a frame inversion driving, a scanning (gate) line inversion driving, a data (source) line inversion driving method, a dot inversion driving and the like.

Among these driving methods, although the frame inversion driving method exhibits the lowering of power consumption, the method has a disadvantage that the image quality is not so good. Further, although the data line inversion driving and the dot inversion driving exhibit the good image quality, these methods have a disadvantage that the high voltage is necessary for driving the display panel.

Accordingly, this embodiment adopts the scan line inversion driving shown in FIG. 4. In this scan line inversion driving, the voltage applied to the liquid crystal element has the polarity thereof inverted every scanning period (every scan line). For example, the voltage of positive polarity is applied to the liquid crystal element during the first scanning period (scan line), the voltage of negative polarity is applied to the liquid crystal element during the second scanning period, and the voltage of positive polarity is applied to the liquid crystal element during the third scanning period. On the other hand, in the next frame, the voltage of negative polarity is applied to the liquid crystal element during the first scanning period, the voltage of positive polarity is applied to the liquid crystal element during the second scanning period, and the voltage of negative polarity is applied to the liquid crystal element during the third scanning period.

Then, in this scan line inversion driving, the voltage level of the counter electrode VCOM has the polarity thereof inverted every scanning period.

Figure 5:
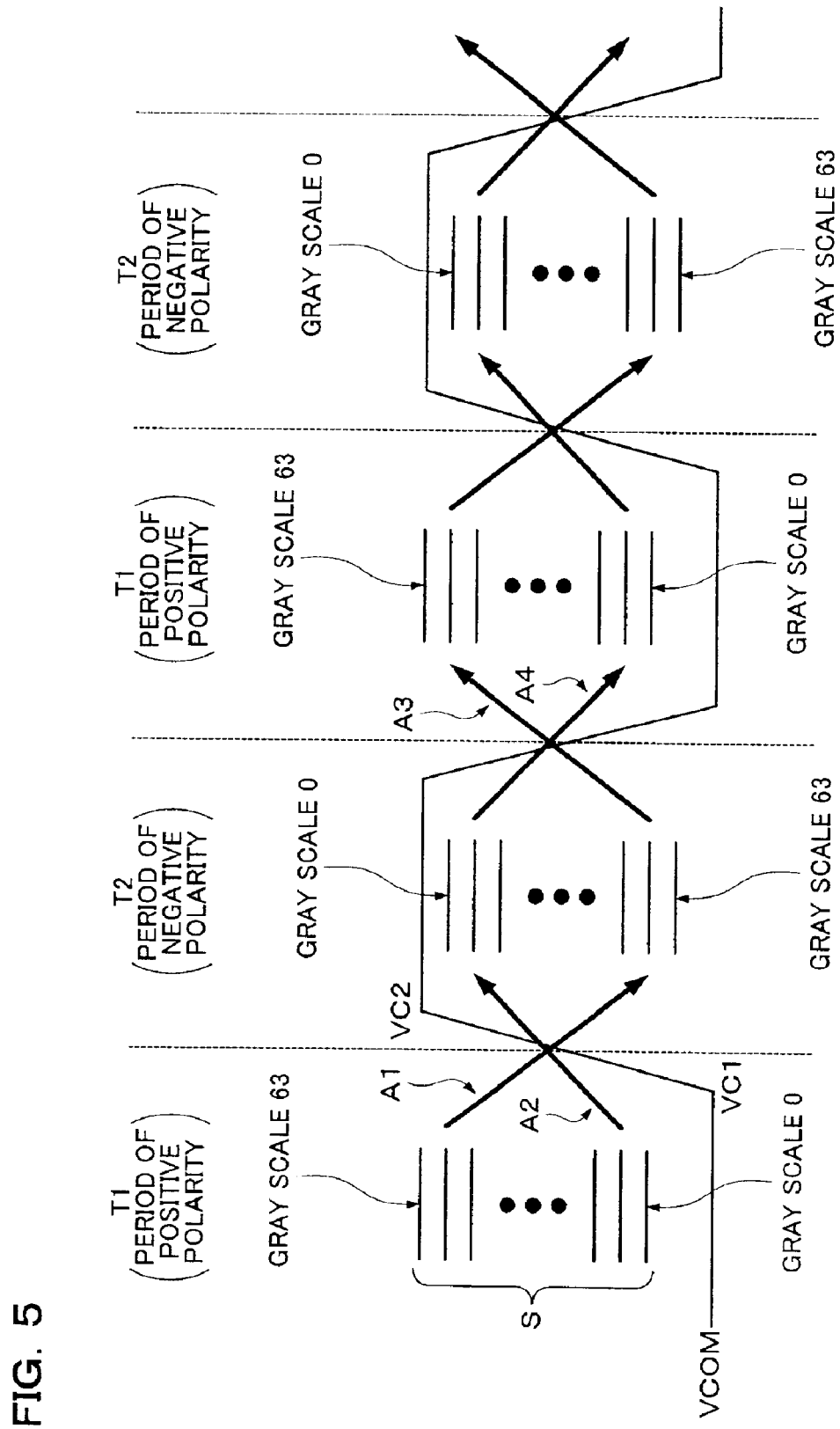
FIG. 5 is a timing waveform chart showing the change of voltage levels of a counter electrode and data line.

More specifically, as shown in FIG. 5, the voltage level of the counter electrode VCOM becomes VC1 (first voltage level) during the period T1 of positive polarity (first period)

and becomes VC2 (second voltage level) during the period T2 of negative polarity(second period).

Here, the period T1 of positive polarity is a period in which the voltage level of the data line S (pixel electrode) becomes higher than the voltage level of the counter electrode VCOM. During this period T1, the voltage of positive polarity is applied to the liquid crystal element. On the other hand, the period T2 of negative polarity is a period in which the voltage level of the data line S (pixel electrode) becomes lower than the voltage level of the counter electrode VCOM. During this period T2, the voltage of negative polarity is applied to the liquid crystal element. Further, VC2 is the voltage level which is obtained by performing the inversion of polarity of VC1 with respect to a given voltage level.

In this manner, by performing the inversion of polarity of the counter electrode VCOM, the voltage necessary for driving the display panel can be lowered. Accordingly, the dielectric strength of the driving circuit can be lowered leading to the simplifying of the manufacturing process and the reduction of the manufacturing cost.

However, it has been found that the method which performs the inversion of polarity of the counter electrode VCOM has following problems in view of the lowering of power consumption of circuits.

For example, as indicated by A1 and A2 in FIG. 5, when the period is changed from the period T1 to the period T2, there may be a case (A1) that the voltage level of the data line S is changed to the low potential side and also there exists a case (A2) that the voltage level of the data line S is changed to the high potential side. In the same manner, as indicated by A3 and A4 in FIG. 5, when the period is changed from the period T2 to the period T1, there may be a case (A3) that the voltage level of the data line S is changed to the high potential side and also there exists a case (A4) that the voltage level of the data line S is changed to the low potential side.

For example, when the gray scale of the data line S during the period T1 is 63 and the gray scale of the data line S during the period T2 is also 63, the voltage level of the data line S is changed to the low potential side as indicated by A1 in FIG. 5. On the other hand, when the gray scale of the data line S during the period T1 is 0 and the gray scale of the data line S during the period T2 is also 0, the voltage level of the data line S is changed to the high potential side.

In this manner, to perform the inversion of polarity of the counter electrode VCOM in the active matrix type liquid crystal device, the direction of the change of the voltage level of the data line S depends on the gray scale level. Accordingly, there has been a problem that the power consumption lowering technique of the passive matrix type liquid crystal device disclosed in Japanese Laid-open Patent Publication 98577/1995 cannot be applied directly or as it is.

Figure 6:
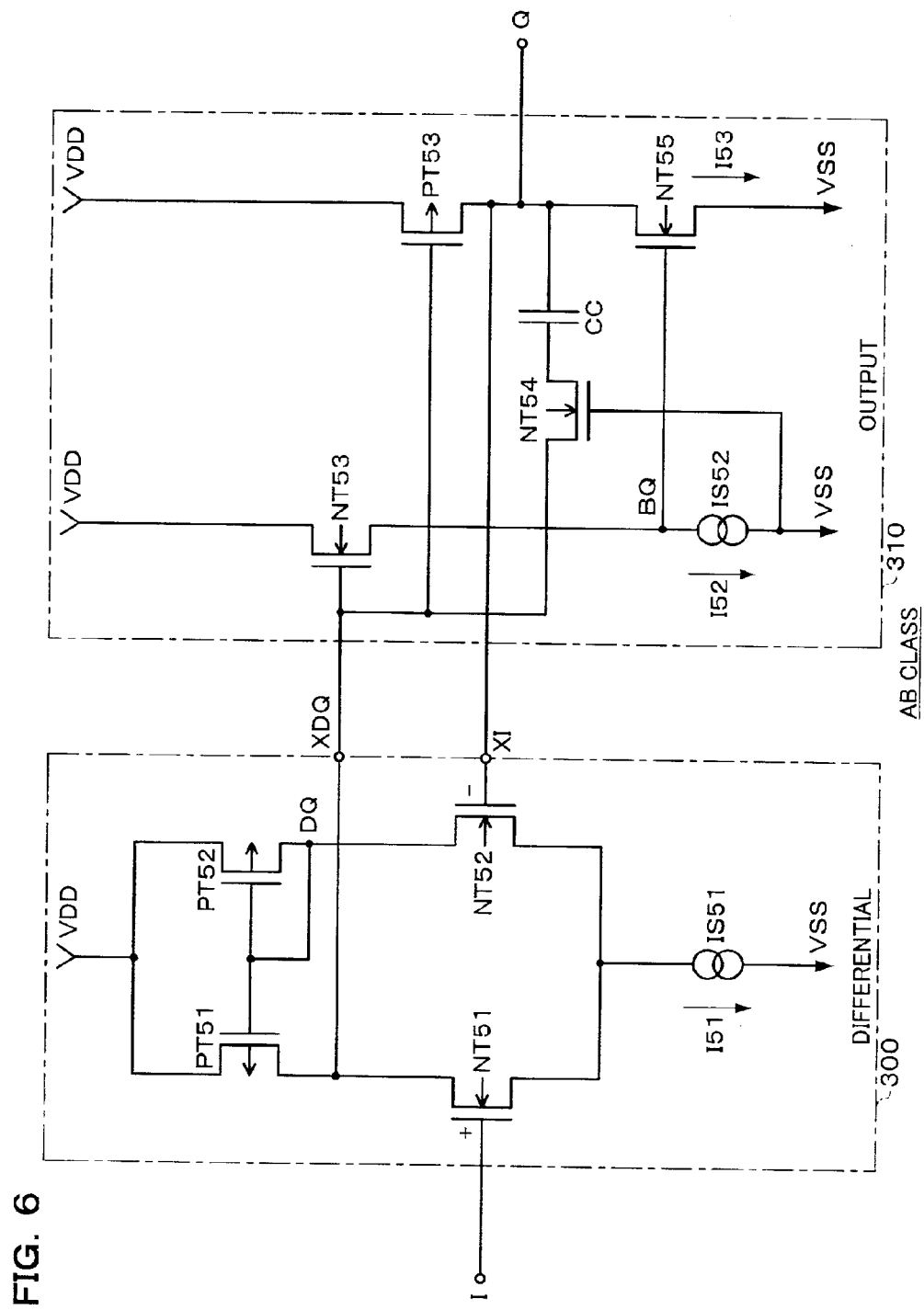
FIG. 6 is a diagram showing an example of the configuration of an operational amplifier circuit of AB class.

Therefore, in the conventional active matrix type liquid crystal device, as an operational amplifier circuit (OPC including the output buffer 29 shown in FIG. 2) for driving the data line, an AB class (push-pull method) operational amplifier circuit shown in FIG. 6 has been used.

This AB class operational amplifier circuit includes a differential section 300 and an output section 310 which has a P-type (first conductivity type in a broad sense) driving transistor PT53 and an N-type (second conductivity type in a broad sense) driving transistor NT55.

Here, the differential section 300 includes P-type transistors PT51 and PT52 which have gate electrodes thereof connected to an output DQ of the differential section 300 in common, N-type transistors NT51 and NT52 which have gate electrodes thereof connected to inputs I and XI of the differential section 300, and a current source IS51.

The output section 310 includes an inversion circuit which is constituted of an N-type transistor NT53 which has a gate electrode thereof connected to an output XDQ (inversion output) of the differential section 300 and a current source IS52. Further, the output section 310 includes the P-type driving transistor PT53 which has a gate electrode thereof connected to the output XDQ of the differential section 300, the N-type driving transistor NT55 which has a gate electrode thereof connected to an output BQ of the inversion circuit, an N-type transistor NT54 which has a gate electrode thereof connected to a VSS, and capacitance CC for phase compensation.

In the operational amplifier circuit shown in FIG. 6, an output Q of the output section 310 is connected to the input XI (inversion input) of the differential section 300 thus establishing a voltage follower connection.

Further, the current sources IS51 and IS52 are constituted of N-type transistors which have gate electrodes thereof connected to the reference voltage (constant voltage), for example.

In the AB class operational amplifier circuit shown in FIG. 6, the output section 310 includes both of the P-type driving transistor PT53 and the N-type driving transistor NT55. Accordingly, in the case of A1 and A4 in FIG. 5, the N-type driving transistor NT55 is operated so that the voltage level of the data line S can be rapidly lowered to the low potential side. On the other hand, in the case of A2 and A3 in FIG. 5, the P-type driving transistor PT53 is operated so that the voltage level of the data line S can be rapidly elevated to the high potential side. Accordingly, in the liquid crystal device which performs the scan line inversion driving while inverting the polarity of the counter electrode VCOM, in most cases, the AB class operational amplifier circuit shown in FIG. 6 has been used as an operational amplifier circuit which an output buffer of a data line driving circuit includes.

However, the AB class operational amplifier circuit shown in FIG. 6 includes three paths in which an electric current flows, that is, the paths for electric currents I51, I52, I53 and hence, the electric current which is consumed uselessly is increased thus giving rise to a problem that the power consumption is increased. Particularly, with respect to this type of AB class operational amplifier circuit, to properly control gate electrodes of the driving transistors PT53 and NT55, a circuit having a configuration which uses four or more current paths is used in many cases. When such a circuit configuration is adopted, the power consumption is further increased. On the other hand, when the electric currents I51, I52 and I53 are reduced in amount to lower the power consumption, this brings about the lowering of response speed and the deterioration of frequency characteristics.

Further, with respect to the operational amplifier circuit shown in FIG. 6, a large number of these operational amplifier circuits are provided corresponding to respective data line as shown in FIG. 2. Accordingly, when the power consumption of each operational amplifier circuit is increased, the power consumption of the liquid crystal device is increased corresponding to the number of the operational amplifier circuits thus giving rise to a problem that the lowering of power consumption of the liquid crystal device is considerably hindered.

Accordingly, to solve such a problem, this embodiment adopts a method which will be described hereinafter.

2.2 Changeover of Operational Amplifiers

First of all, in this embodiment, the operational amplifiers for driving the data line are changed over corresponding to the changeover of the voltage level of the counter electrode VCOM.

Figure 7A:
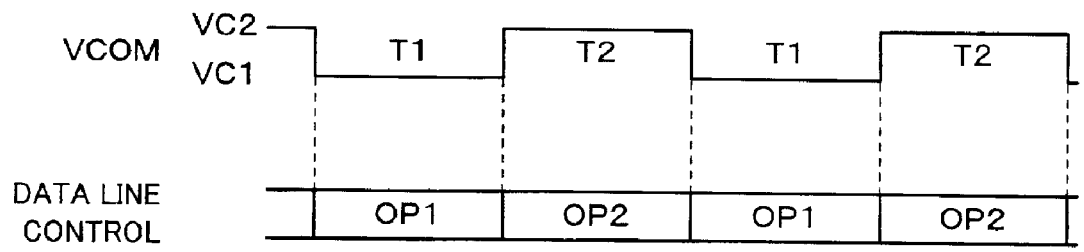
FIG. 7A and FIG. 7B are diagrams describing a method of changing over the operational amplifier when VCOM is changed over.

More specifically, as shown in FIG. 7A, during the period T1 (first period, period of positive polarity shown in FIG. 5) in which the voltage level of the counter electrode VCOM becomes VC1 (first voltage level), the data line is driven using the operational amplifier OP1. On the other hand, during the period T2 (second period, period of negative polarity shown in FIG. 5) in which the voltage level of the counter electrode VCOM becomes VC2 (second voltage level which is obtained by inverting the polarity of VC1), the data line is driven using the operational amplifier OP2 which is different from the operational amplifier OP1.

Figure 7B:
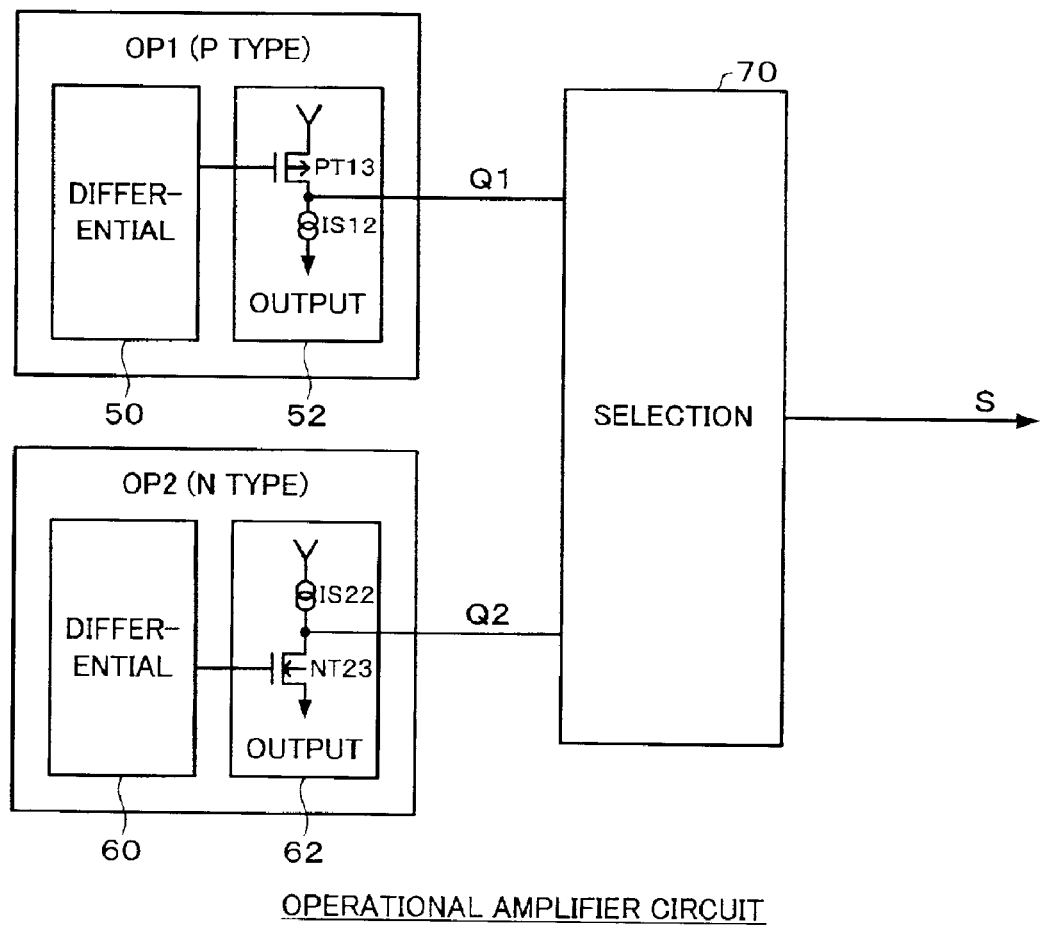

An example of the configuration of the operational amplifier circuit which can realize such a driving method is shown in FIG. 7B. The operational amplifier circuit includes the operational amplifier OP1 (P-type first operational amplifier), the operational amplifier OP2 (N-type second operational amplifier) and a selection circuit 70.

Here, the operational amplifier OP1 (P-type) includes, as shown in FIG. 7B, a differential section 50 and an output section 52 which has a P-type driving transistor PT13 and a current source IS12, for example. Here, the P-tupe driving transistor PT13 has a gate electrode thereof controlled based on an output (inversion output) of the differential section 50.

Further, the operational amplifier OP2 (N-type) includes, as shown in FIG. 7B, a differential section 60 and an output section 62 which has an N-type driving transistor NT23 and a current source IS22, for example. Here, the N-type driving transistor NT23 has a gate electrode thereof controlled based on an output (inversion output) of the differential section 60.

The current sources IS12 and IS22 are served for supplying constant currents and each current source can be constituted of an N-type transistor which connects a gate electrode thereof to a reference voltage, a depression-type transistor or a resistance element. Further, in FIG. 7B, the operational amplifier circuit may be constituted without using the current sources IS12 and IS22.

The selection circuit 70, when the counter electrode VCOM becomes VC1 (during the period T1), selects the output Q1 of the operational amplifier OP1 and connects the output Q1 with the data line S. On the other hand, the selection circuit 70, when the counter electrode VCOM becomes VC2 (during the period T2), selects the output Q2 of the operational amplifier OP2 and connects the output Q2 with the data line S. Due to such an operation, the data line S can be driven by the operational amplifier OP1 during the period T1 and can be driven by the operational amplifier OP2 during the period T2.

Figure 8:
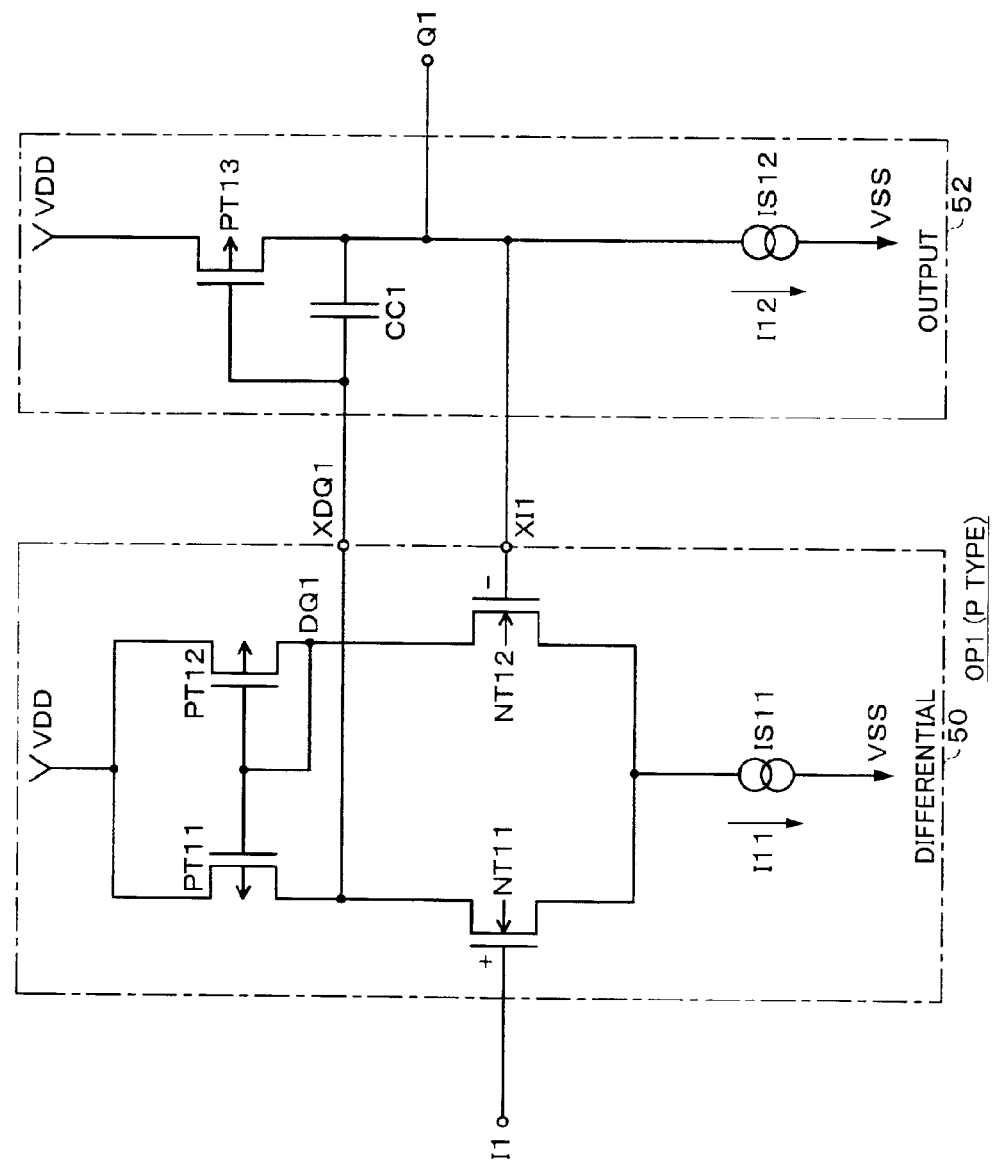
FIG. 8 is a diagram showing an example of the configuration of a P-type operational amplifier.

FIG. 8 shows an example of the configuration of the operational amplifier OP1. This operational amplifier OP1 is a P-type operational amplifier whose output section 52 includes a P-type driving transistor PT13 while eliminating an N-type driving transistor.

A differential section 50 of the operational amplifier OP1 includes P-type transistors PT11 and PT12 which have gate electrodes thereof connected in common to an output DQ1 of the differential section 50, N-type transistors NT11 and NT12 which have gate electrodes thereof connected to inputs I1 and XI1 of the differential section 50 and a current source IS11 which is provided at the VSS (second power source) side.

The output section 52 of the operational amplifier OP1 includes the P-type transistor PT13 which has a gate electrode thereof connected to an output XDQ1 (inversion output) of the differential section 50, a current source IS12 which is provided at the VSS side and capacitance CC1 for phase compensation.

The operational amplifier OP1 shown in FIG. 8 has an output Q1 thereof connected to an input XI1 (inversion input) of the differential section 50 thus establishing a voltage follower connection.

Figure 9:
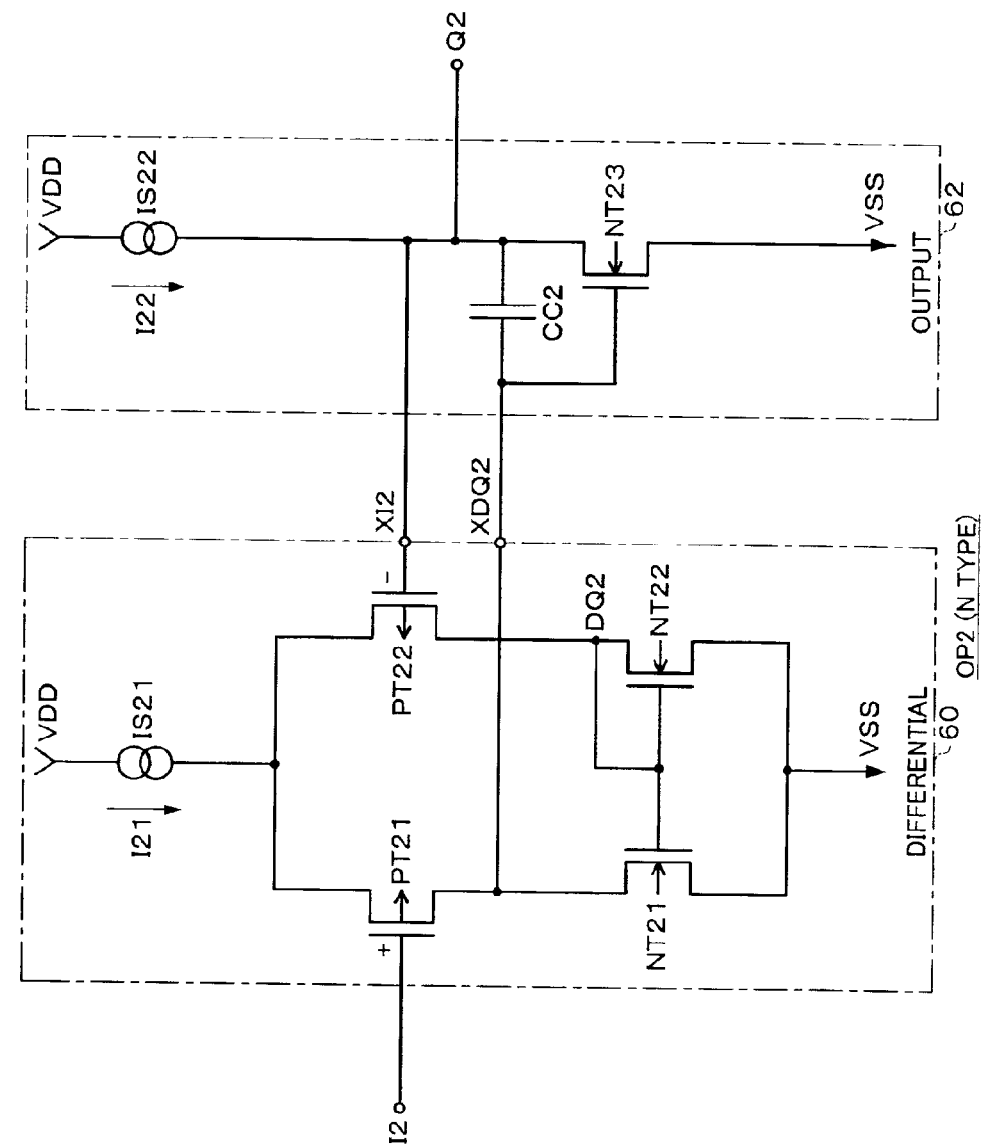
FIG. 9 is a diagram showing an example of the configuration of an N-type operational amplifier.

FIG. 9 shows an example of the configuration of the operational amplifier OP2. This operational amplifier OP2 is an N-type operational amplifier whose output section 62 includes an N-type driving transistor NT23 while eliminating a P-type driving transistor.

A differential section 60 of the operational amplifier OP2 includes a current source IS21 which is provided at the VDD (first power source) side, P-type transistors PT21 and PT22 which have gate electrodes thereof connected to inputs I2 and XI2 of the differential section 60, and N-type transistors NT21 and NT22 which have gate electrodes thereof connected in common to an output DQ2 of the differential section 60.

The output section 62 of the operational amplifier OP2 includes a current source IS22 which is provided at the VDD side, the N-type transistor NT23 which has a gate electrode thereof connected to an output XDQ2 (inversion output) of the differential section 60, and capacitance CC2 for phase compensation.

The operational amplifier OP2 shown in FIG. 9 has an output Q2 thereof connected to an input XI2 (inversion input) of the differential section 60 thus establishing a voltage follower connection.

In the operational amplifier OP1 shown in FIG. 8, the paths in which the electric current flows are constituted of only two paths I11 and I12. In the same manner, in the operational amplifier OP2 shown in FIG. 9, paths in which the electric current flows are constituted of only two paths I21 and I22. Accordingly, compared to the AB class operational amplifier circuit shown in FIG. 6 which uses three or more electric current paths, these operational amplifiers OP1 and OP2 can reduce the current which flows uselessly so that the lowering of power consumption can be achieved.

Further, with respect to the AB class operational amplifier circuit shown in FIG. 6, when the current supply ability of the driving transistors PT53 and NT55 is decreased, the data-line driving ability is lowered. Accordingly, it is not possible to effectively reduce the current I53 which flows the paths of the driving transistors PT53 and NT55.

To the contrary, with respect to the operational amplifier OP1 shown in FIG. 8, in a situation (B15 shown in FIG. 17 which will be described later) where it is not so much necessary to lower the voltage level of the output Q1 to the low potential side, the current I12 which flows in the current source IS12 can be made extremely small. In the same manner, with respect to the operational amplifier OP2 shown in FIG. 9, in a situation (B5 shown in FIG. 17 which will be described later) where it is not so much necessary to elevate the voltage level of the output Q2 to the high potential side, the current I22 which flows in the current source IS22 can be made extremely small. Accordingly, compared to the AB class operational amplifier circuit shown in FIG. 6 which cannot make the current I53 at the output section 310 sufficiently small, the operational amplifiers OP1 and OP2 shown in FIG. 8 and FIG. 9 can make the currents I12 and I22 which flow in the output sections 52 and 62 sufficiently small so that the power consumption can be extremely reduced.

Then, in this embodiment, as shown in FIG. 7A, only the operational amplifier OP1 whose power consumption is extremely small is used during the period T1 and only the operational amplifier OP2 whose power consumption is also extremely small is used during the period T2. Accordingly, compared to a conventional method using the AB class operational amplifier circuit shown in FIG. 6 which consumes a large amount of power during the whole periods (T1 and T2), the power consumption of the liquid crystal device can be drastically reduced.

Further, with respect to the operational amplifier circuit of this embodiment shown in FIG. 7B, the operational amplifier circuits are provided corresponding to respective data lines as shown in FIG. 2 and hence are provided corresponding to the number of data lines whereby the number of operational amplifier circuits is extremely large. Accordingly, when the power consumption of each operational amplifier circuit can be decreased, the power consumption of the liquid crystal device can be reduced correspondingly to the number of operational amplifier circuits so that the power consumption of the liquid crystal device can be drastically reduced.

2.3 Setting of Output of Operational Amplifier Circuit to High Impedance State

Further, in this embodiment, the output of the operational amplifier circuits can be set to the high impedance state.

Figure 10:
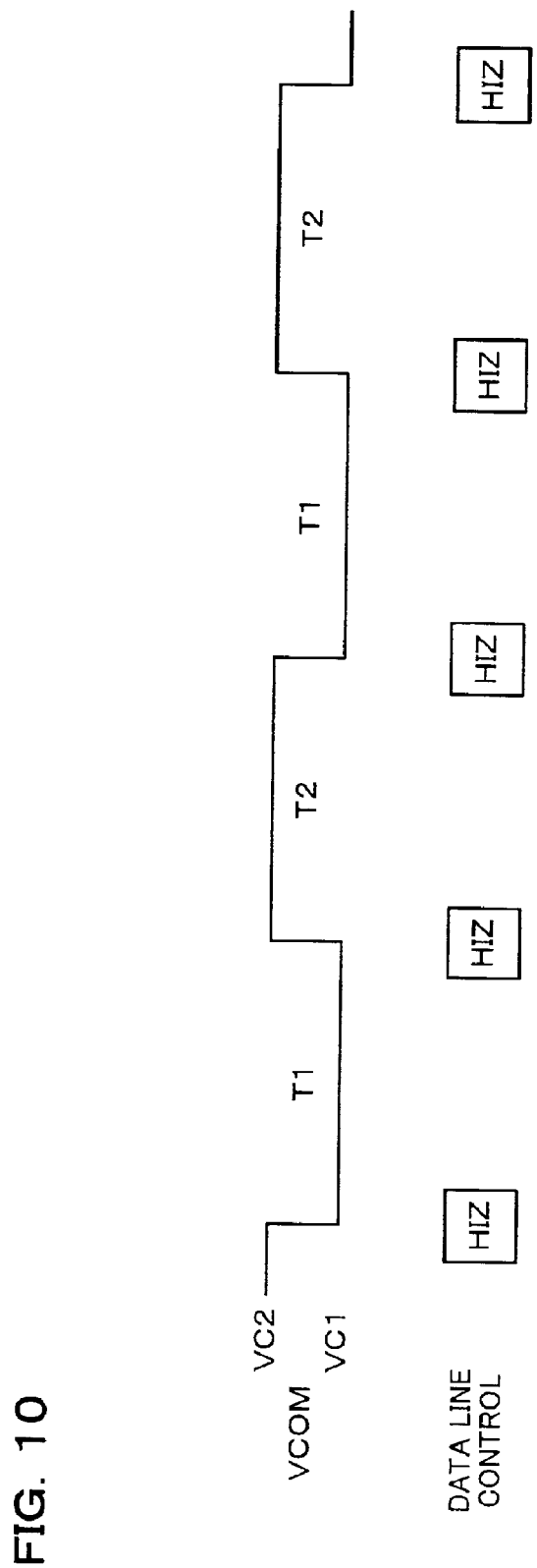
FIG. 10 is a diagram describing a method of setting an output of the operational amplifier circuit in high impedance state at the time of the changeover of VCOM.

More specifically, as shown in FIG. 10, this embodiment adopts a driving method in which in a given period during a transition (including the transition timing) between the period T1 (first period) in which the voltage level of the counter electrode VCOM becomes VC1 (first voltage level) and the period T2 (second period) in which the voltage level of the counter electrode VCOM becomes VC2 (second voltage level), the output of the operational amplifier circuit is set to the high impedance state (HIZ).

Figure 11A:
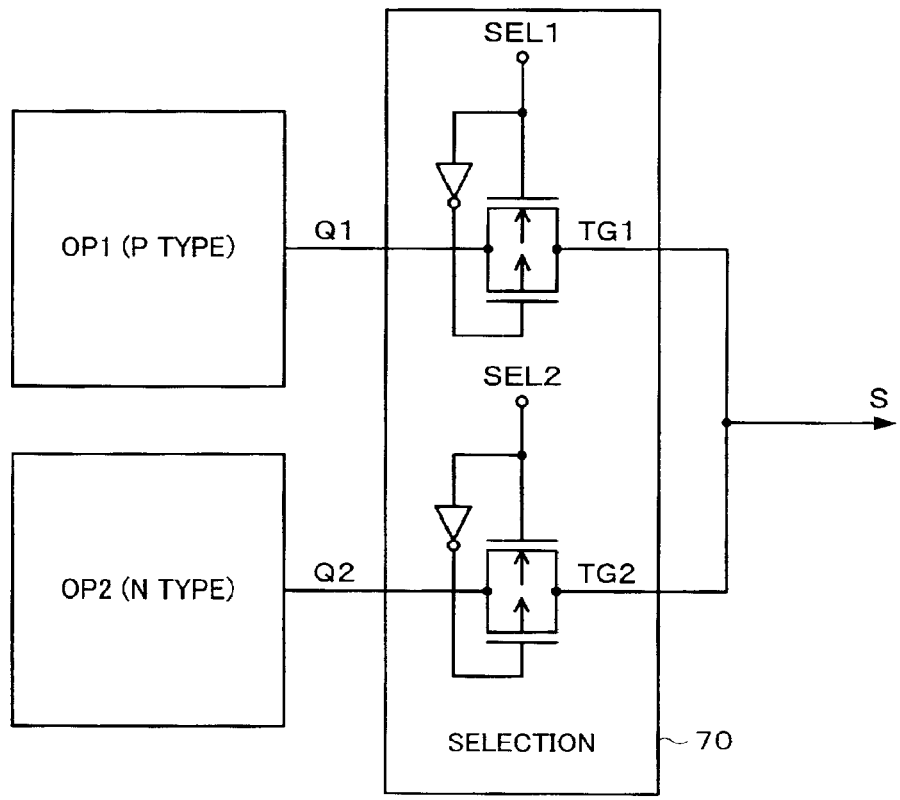
FIG. 11A and FIG. 11B are also diagrams describing a method of setting an output of the operational amplifier circuit in high impedance state at the time of the changeover of VCOM.

An example of the configuration of an operational amplifier circuit which can realize such a driving method is shown in FIG. 11A. This operational amplifier circuit includes an operational amplifier OP1 (P-type), an operational amplifier OP2 (N-type) and a selection circuit 70. Here, an output of the selection circuit 70 is set to the high impedance state in a given period during the transition between the period T1 and the period T2.

More specifically, the selection circuit 70 includes transfer gates TG1 and TG2 (path transistors, switching elements in a broad sense) where a P-type transistor and an N-type transistor are connected in parallel. The transfer gate TG1 is subjected to an ON/OFF control in response to a signal SEL1 and the transfer gate TG2 is subjected to an ON/OFF control in response to a signal SEL2.

Figure 11B:
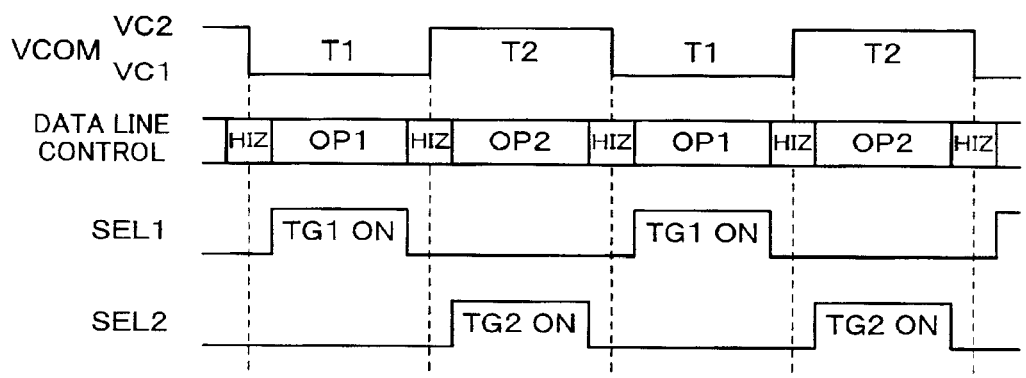

FIG. 11B shows timing waveforms of the ON/OFF control of the transfer gates TG1 and TG2 using the signals SEL1 and SEL2.

As shown in FIG. 11B, when the signal SEL1 becomes active (H level) during the period T1 in which the voltage level of the counter electrode VCOM becomes VC1, the transfer gate TG1 is turned on (conductive state). Then, the operational amplifier OP1 is selected and the output Q1 of the operational amplifier OP1 is connected to the data line S. Accordingly, the data line S is driven by the P-type operational amplifier OP1.

On the other hand, when the signal SEL2 becomes active during the period T2 in which the voltage level of the counter electrode VCOM becomes VC2, the transfer gate TG2 is turned on. Then, the operational amplifier OP2 is selected and the output Q2 of the operational amplifier OP2 is connected to the data line S. Accordingly, the data line S is driven by the N-type operational amplifier OP2.

Then, when both of the signals SEL1 and SEL2 become non-active (L level), both of the transfer gates TG1 and TG2 are turned off (non-conductive state). Then, the data line S is driven by neither the operational amplifier OP1 nor the operational amplifier OP2 and the data line S is in the high impedance state (HIZ). Due to such operations, it is possible to set the data line S to the high impedance state at the time of the transition between the periods T1 and T2.

In this manner, according to this embodiment, using the signals SEL1 and SEL2 which become active during the periods T1 and T2 and make the periods during which these signals become active not overlapped to each other, the ON/OFF control of the transfer gates TG1 and TG2 (switching elements) is performed. Due to such a control, the changeover driving of the data line S using the operational amplifiers OP1 and OP2 and the setting of the data line S to the high impedance can be realized with the simple circuit configuration and the simple circuit control.

Although the high impedance control of the outputs of the operational amplifiers are realized by using the method which sets the output of the selection circuit 70 to the high impedance state in FIG. 11A and FIG. 11B, the high impedance control may be realized by a method which sets the outputs Q1 and Q2 of the operational amplifiers OP1 and OP2 to the high impedance state.

3. Principle of Lowering of Power Consumption

Subsequently, the principle of the method of lowering the power consumption according to this embodiment is described.

In the liquid crystal device, to enhance the image quality while holding the voltage level of the pixel electrode during the non-selective periods, the auxiliary capacitance is connected to the pixel electrode for assisting the liquid crystal capacitance. As a method of forming such auxiliary capacitance, there exist a storage capacitance method shown in FIG. 12A and an addition capacitance method shown in FIG. 12B.

In the storage capacitance method shown in FIG. 12A, the auxiliary capacitance CS is formed between the pixel electrode and the counter electrode VCOM. This can be realized by separately forming wiring of the counter electrode VCOM on the active matrix substrate, for example. On the other hand, in the addition capacitance method shown in FIG. 12B, the auxiliary capacitance CS is formed between the pixel electrode and the scan line (gate line) of the preceding stage. This can be realized by a layout which overlaps the pattern of the pixel electrode with the pattern of the scan line of the preceding stage.

Although the power consumption lowering method of this embodiment is applicable to both the storage capacitance method shown in FIG. 12A and the addition capacitance method shown in FIG. 12B, to simplify the explanation, a case in which the power consumption lowering method is applied to the storage capacitance method shown in FIG. 12A is described by way of an example.

Here, in the storage capacitance method shown in FIG. 12A, the parasitic capacitance between the gate and the drain of the TFT and the parasitic capacitance between the gate and the source of the TFT act in the direction to suppress the change of the voltage level of the data line. To the contrary, in the addition capacitance method shown in FIG. 12B, the voltage level of the scan line of the preceding stage is also changed at the time of changing of the voltage level of the counter electrode VCOM. Accordingly, the change of the voltage level of the scan line acts in the direction to assist the change of the voltage level of the data line. Accordingly, with respect to the method of the embodiment which changes the voltage level of the data line in response to the change of the voltage level of the counter electrode VCOM and lowers the power consumption by utilizing the change of the voltage level of the data line, the addition capacitance method shown in FIG. 12B is more effective.

FIG. 13 conceptually shows an example of signal waveforms of the data line S, the counter electrode VCOM and the scanning signal lines G in the case of the storage capacitance method.

As shown in FIG. 13, the voltage levels of the data line S and the counter electrode VCOM are subjected to the inversion of polarity with reference to a given voltage level every scanning period. Then, when the voltage level of the data line S has a potential higher than that of the counter electrode VCOM, the voltage applied to the liquid crystal element has the positive polarity, while when the voltage level of the counter electrode VCOM has a potential higher than that of the data line S, the voltage applied to the liquid crystal element has the negative polarity. In this manner, by inverting the polarity of the voltage applied to the liquid crystal element every scanning period, it is possible to prevent the direct voltage from being applied to the liquid crystal element for a long time so that the life of the liquid crystal element can be prolonged.

When the counter electrode VCOM is subjected to the inversion of polarity so that the voltage level is changed from VC1 to VC2 or from VC2 to VC1 as shown in FIG. 13, the change of the voltage level of the counter electrode VCOM is transmitted to the data line S due to the capacitive coupling derived from the parasitic capacitance between the counter electrode VCOM and the data line S.

Figure 14:
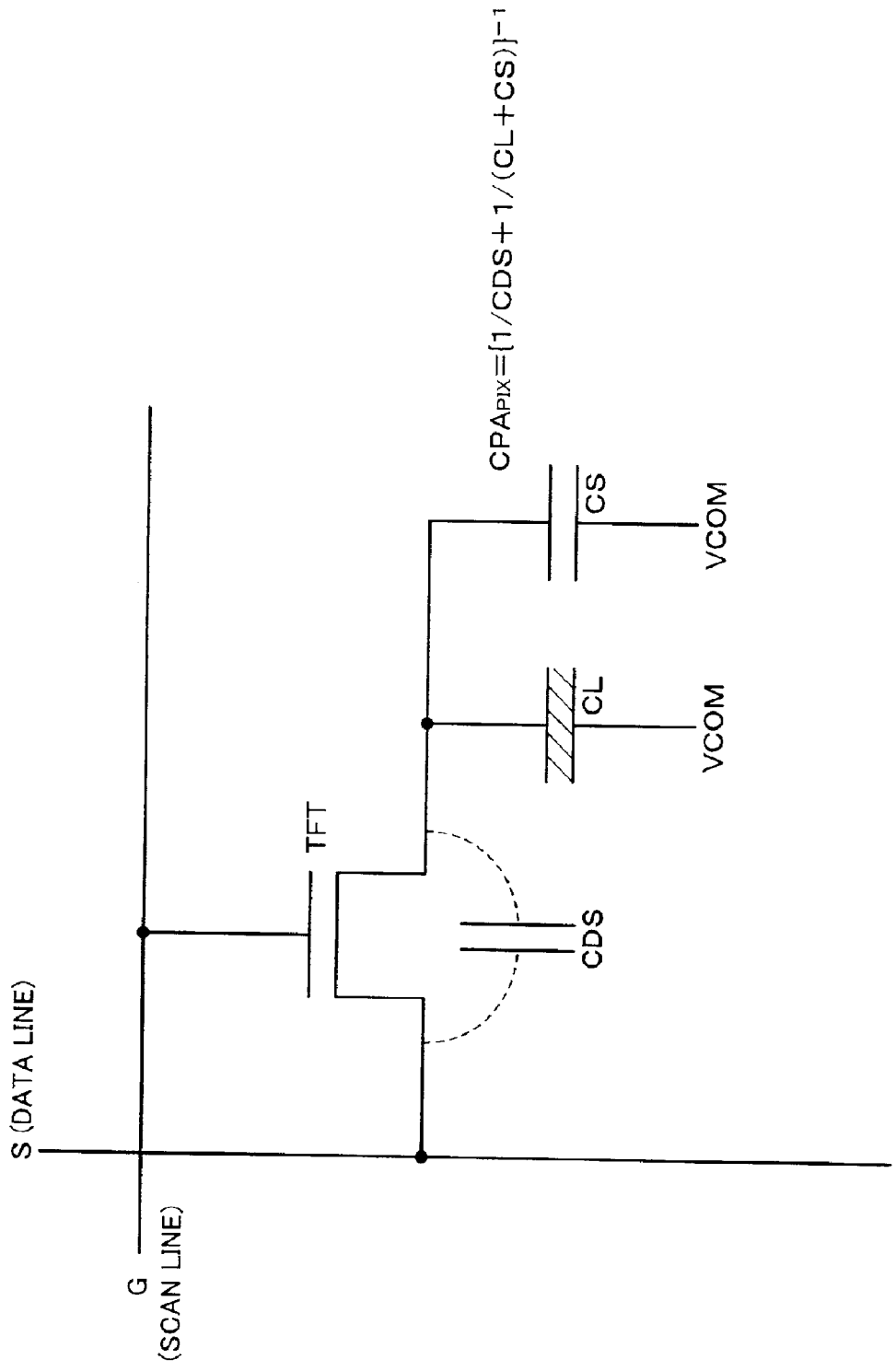
FIG. 14 is a diagram describing parasitic capacitance between the counter electrode and the data line.

Here, as shown in FIG. 14, the parasitic capacitance $CPA_{PIX}$ between the counter electrode VCOM and the data line S per 1 pixel can be expressed by a following equation.

$$CPA_{PIX} = \{1/CDS + 1/(CL+CS)\}^{-1} \quad (1)$$

In this equation (1), CDS is the parasitic capacitance between the drain and the source of the TFT, CL is the liquid crystal capacitance and CS is the auxiliary capacitance. In the equation (1), the parasitic capacitance between the gate and the drain of the TFT and the parasitic capacitance between the gate and the source of the TFT are ignored.

Figure 15:
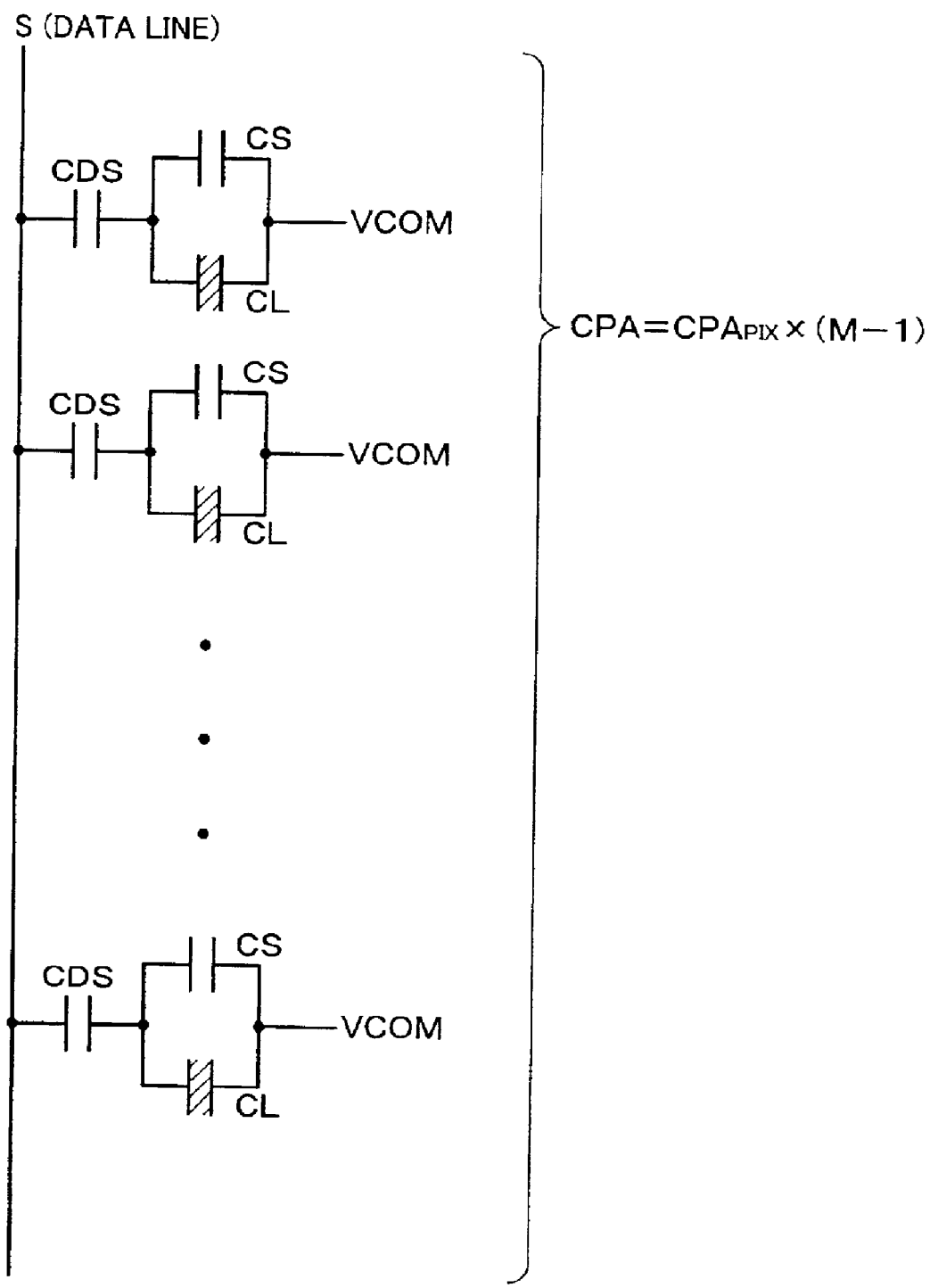
FIG. 15 is a diagram describing parasitic capacitance between the counter electrode and the data line.

Then, as shown in FIG. 15, the parasitic capacitance CPA between the counter electrode VCOM and the data line S per 1 data line can be expressed by a following equation.

$$CPA = CPA_{PIX} \times (M-1) \quad (2)$$

In the equation (2), M indicates the number of scan lines. The reason that CPA is not calculated as $CPA_{PIX} \times M$ but is calculated as $CPA_{PIX} \times (M-1)$ is that there is no influence of the parasitic capacitance CPAPIX with respect to the pixel selected by the scan line.

For example, in the above-mentioned equations (1), (2), assuming that CL+CS=0.1 pf (pico farad), CDS=0.05 pf and the number of scan lines M=228, the parasitic capacitance per 1 pixel $CPA_{PIX}$ becomes approximately 0.33 pf and the parasitic capacitance per 1 data line CPA becomes approximately 7.6 pf.

In this manner, the parasitic capacitance of a level which cannot be ignored is formed between the counter electrode VCOM and the data line. Accordingly, as shown in FIG. 16, when the voltage level of the counter electrode VCOM is changed with the data line S held in the non-driven state, the voltage level of the data line S is also changed due to the capacitive coupling derived from the parasitic capacitance CPA.

Figure 16:
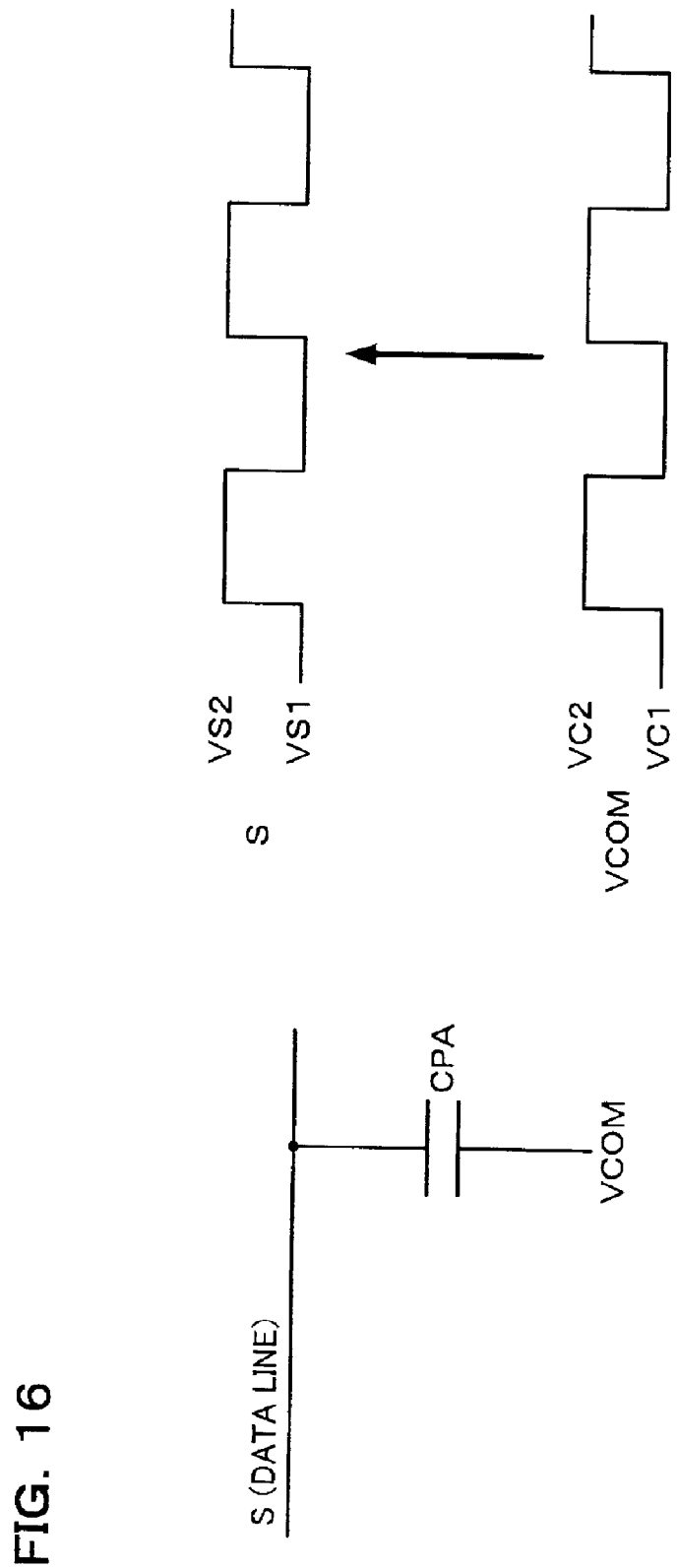
FIG. 16 is a diagram describing the change of the voltage level of the data line due to the parasitic capacitance.

For example, as shown in FIG. 16, when the voltage level of the counter electrode VCOM is changed from VC1 to VC2 or from VC2 to VC1, the voltage level of the data line S is changed from VS1 to VS2 or from VS2 to VS1. Here, in an ideal case that other parasitic capacitance is not formed on the data line S, the relationship VS2−VS1=VC2−VC1 is established among the voltage levels. However, in an actual operation, since the parasitic capacitance is present between the data line S and the substrate as well as between the data line S and the atmosphere, the relationship among the voltage levels becomes VS2−VS1<VC2−VC1.

In this embodiment, the lowering of power consumption of the liquid crystal device is realized by positively utilizing such a change of the voltage level of the data line S derived from the parasitic capacitance CPA.

Figure 17:
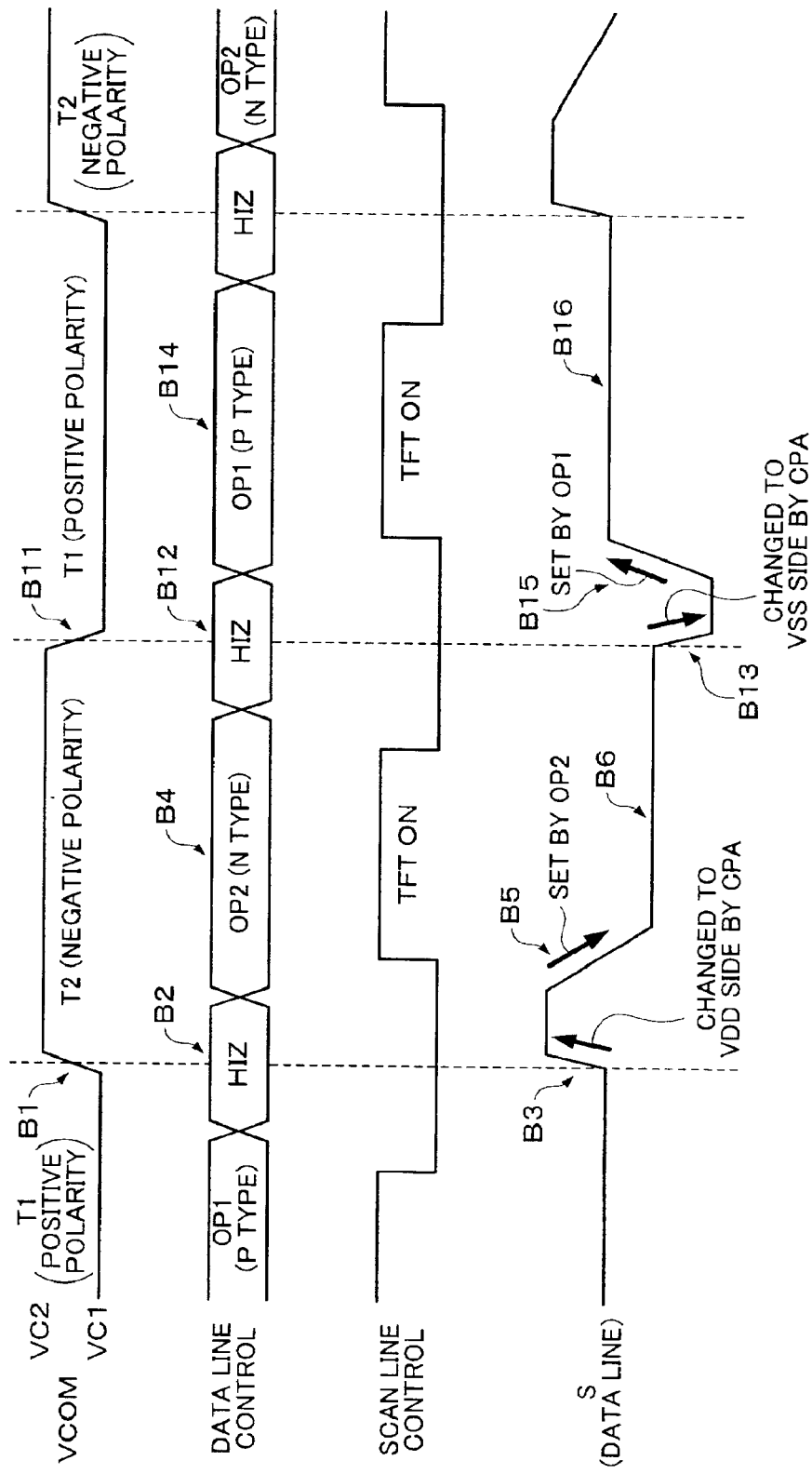
FIG. 17 is a timing waveform chart describing a driving method of this embodiment.

For example, at B1 in a timing waveform chart shown in FIG. 17, the voltage level of the counter electrode VCOM is changed from VC1 at the VSS (second power source) side to VC2 at the VDD (first power source) side. In this case, according to this embodiment, at the timing of switcing the voltage level, the data line S (output of the operational amplifier circuit) is set to the high impedance state as indicated by B2 (see FIG. 10 to FIG. 11B).

By setting the data line S to the high impedance state in this manner, the data line S is in the non-driven state. Accordingly, due to the parasitic capacitance CPA between the counter electrode VCOM and the data line S (see FIG. 14 to FIG. 16), the voltage level of the data line S is changed to the VDD side (high potential side) as indicated by B3 in FIG. 17.

Then, in this embodiment, as indicated by B4 in FIG. 17, during the period T2 in which the voltage level of the counter electrode VCOM becomes VC2, the data line S is driven by the N-type operational amplifier OP2 (see FIG. 7A to FIG. 9). Accordingly, the voltage level of the data line which is changed to the VDD side as indicated by B3 in FIG. 17 is changed to the VSS side (low potential side) by driving the operational amplifier OP2 as indicated by B5 and is set to the voltage level as indicated by B6 corresponding to the gray scale level (see FIG. 5).

In this case, OP2 is the N-type operational amplifier having the N-type driving transistor NT 23 as shown in FIG. 9. Accordingly, by utilizing the driving ability of the driving transistor NT23 provided at the VSS side, the voltage level of the data line S can be easily changed to the VSS side (low potential side) as indicated by B5 shown in FIG. 5. In other words, since it is unnecessary to change the voltage level of the data line S to the VDD side (high potential side), the electric current which flows in the current source IS22 in FIG. 9 can be reduced (or eliminated). Accordingly, the power consumption of the operational amplifier circuit can be lowered so that the power consumption of the liquid crystal device can be lowered.

On the other hand, at B11 in FIG. 17, the voltage level of the counter electrode VCOM is changed from VC2 of the VDD side to VC1 of the VSS side. In this case, according to this embodiment, the data line S is set to the high impedance state as indicated by B12 at the timing of the changeover of the voltage level.

When the data line S is set to the high impedance state, the data line S is in the non-driven state. Accordingly, as indicated by B13 in FIG. 17, the voltage level of the data line S is changed to the VSS side due to the parasitic capacitance CPA generated between the counter electrode VCOM and the data line S.

Then, in this embodiment, as indicated by B14 shown in FIG. 17, during the period T1 in which the voltage level of the counter electrode VCOM becomes VC1, the data line S is driven by the P-type operational amplifier OP1. Accordingly, the voltage level of the data line S which is changed to the VSS side as indicated by B13 shown in FIG. 17 is changed to the VDD side by driving the operational amplifier OP1 as indicated by B15 and is set to the voltage level as indicated by B16 corresponding to the gray scale level.

In this case, OP1 is the P-type operational amplifier having the P-type driving transistor PT13 as shown in FIG. 8. Accordingly, by utilizing the driving ability of the driving transistor PT13 provided at the VDD side, the voltage level of the data line Scan be easily changed to the VDD side as indicated by B15 shown in FIG. 17. In other words, since it is unnecessary to change the voltage level of the data line S to the VSS side, the electric current which flows in the current source IS12 in FIG. 8 can be reduced (or eliminated). Accordingly, the power consumption of the operational amplifier circuit can be lowered so that the power consumption of the liquid crystal device can be lowered.

For example, according to a method which does not set the data line S to the high impedance state at the time of the changeover of the voltage level of the counter electrode VCOM, the data line S is always in the driving state due to the operational amplifier circuit. Accordingly, even when the voltage level of the counter electrode VCOM is changed, the capacitive coupling derived from the parasitic capacitance CPA does not bring about the changes of the voltage level of the data line S as indicated by B3 and B13 in FIG. 17. Accordingly, as has been described previously in conjunction with A1 to A4 in FIG. 5, the direction that the voltage level of the data line S is changed depends on the gray scale level and it is difficult to specify the changing direction to one direction. Accordingly, there is no way but to use the AB class operational amplifier circuit shown in FIG. 6 which can change the voltage level of the data line S to the VDD side as well as to the VSS side with the same driving force. However, since the AB class operational amplifier circuit exhibits the large power consumption, it has been difficult for the liquid crystal device to realize the lowering of power consumption.

To the contrary, by positively utilizing the parasitic capacitance CPA between the counter electrode VCOM and the data line S, this embodiment has succeeded in changing the voltage level of the data line S to the VDD side as well as to the VSS side before driving the data line S as indicated by B3 and B13 in FIG. 17.

Here, when the voltage level of the data line S is changed to the VDD side before driving the data line S as indicated by B3 in FIG. 17, the direction that the voltage level of the data line S is changed thereafter is not dependent on the gray scale level and is set to the VSS side. Accordingly, as the operational amplifier which drives the data line S, it is possible to use the N-type operational amplifier OP2 which exhibits the weak driving force at the VDD side but the strong driving force at the VSS side.

On the other hand, when the voltage level of the data line S is changed to the VSS side before driving the data line S as indicated by B13 in FIG. 17, the direction that the voltage level of the data line S is changed thereafter is not dependent on the gray scale level and is set to the VDD side. Accordingly, as the operational amplifier which drives the data line S, it is possible to use the P-type operational amplifier OP1 which exhibits the weak driving force at the VSS side but the strong driving force at the VDD side.

Here, both of P-type and N-type operational amplifiers OP1 and OP2 exhibit the small power consumption. In this manner, this embodiment can drastically lower the power consumption compared to the method which uses the AB class operational amplifier circuit shown in FIG. 6.

The change width of the voltage level of the data line S at B3 and B13 in FIG. 17 is small when parasitic capacitance (parasitic capacitance between the data line S and the atmosphere, for example) other than the parasitic capacitance CPA is large. Then, when the change width of the voltage level of the data line S is small, depending on the gray scale level, there may arise a state in which the voltage level of the data line S is to be inversely changed to the VDD side at B5 or to the VSS side at B15 in FIG. 17.

However, even when such a state arises, the change of the voltage level at B3 assists the driving of the N-type operational amplifier OP2. That is, the time which the current source IS22 (see FIG. 9) of the operational amplifier OP2 needs to change the voltage level of the data line S to the VDD side can be shortened. In the same manner, the change of the voltage level at B13 also assists the driving of the P-type operational amplifier OP1. That is, the time which the current source IS12 (see FIG. 8) of the operational amplifier OP1 needs to change the voltage level of the data line S to the VSS side can be shortened.

Although the voltage level of the data line S is changed as indicated by B3 and B13 in FIG. 17 by setting the output of the operational amplifier circuit to the high impedance state, the voltage level of the data line S may be changed at the time of the changeover of the counter electrode VCOM by other method which uses an additional transistor (pre-charge transistor, for example) for changing the voltage level, for example.

However, according to the method which sets the output of the operational amplifier circuit to the high impedance state shown in FIG. 17, it is possible to change the voltage level of the data line S as indicated by B3 and B13 by effectively utilizing the charging/discharging of the display panel which is generated by the counter electrode VCOM. Accordingly, the method can enhance the lowering of power consumption compared to the above-mentioned method using the additional transistor.

4. Detailed Example of Operational Amplifier Circuit

Figure 18:
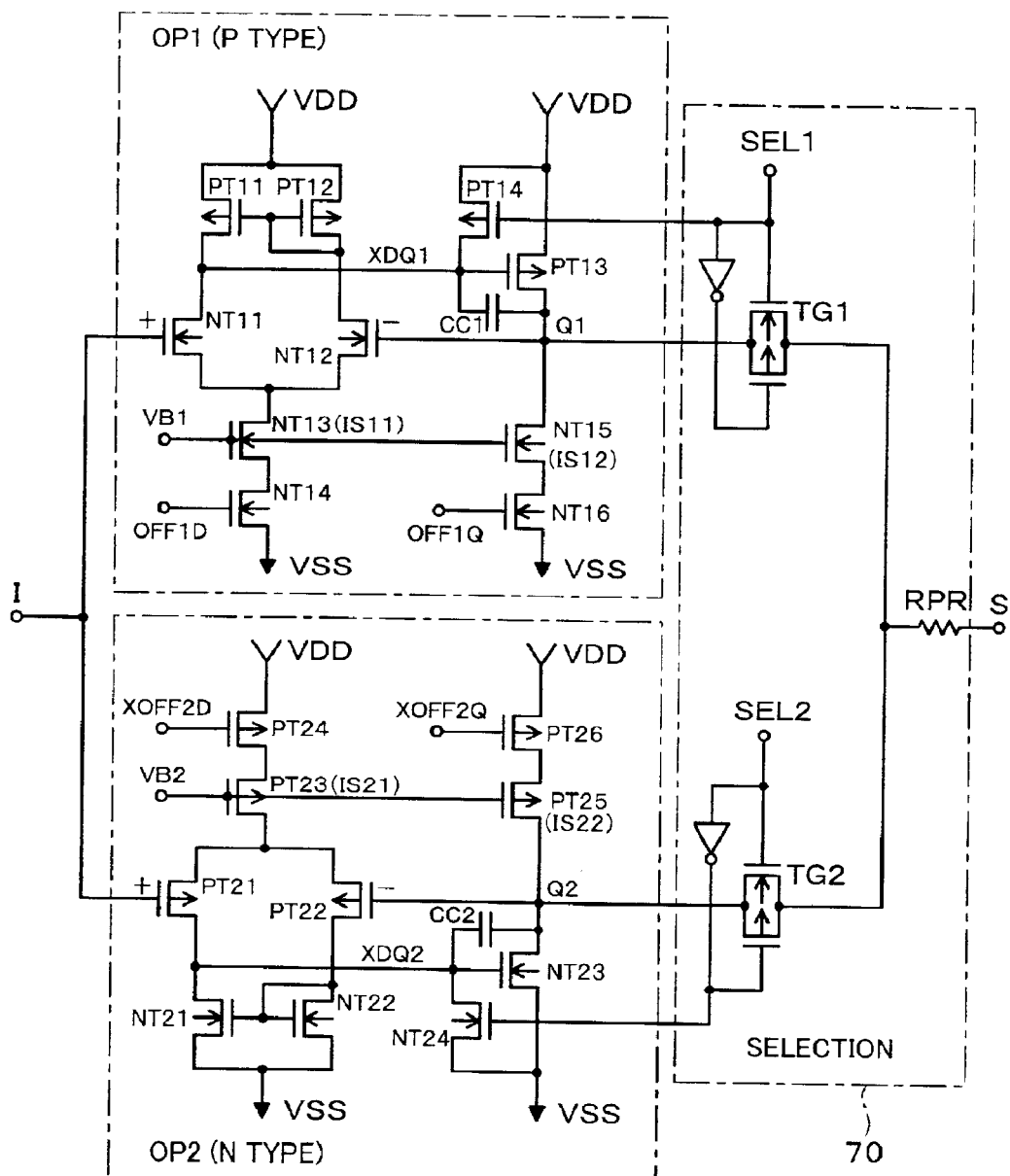
FIG. 18 is a diagram describing an example of a detailed configuration of the operational amplifier circuit.

FIG. 18 shows an example of a detailed configuration of the operational amplifier circuit.

The operational amplifier circuit shown in FIG. 18 differs from the operational amplifier circuit which has been described in conjunction with FIG. 7A to FIG. 11B with respect to a point that the operational amplifier OP1 includes the N-type transistors NT14 and NT16 and the P-type transistor PT14, while the operational amplifier OP2 includes the P-type transistors PT24 and PT26 and the N-type transistor PT24.

In FIG. 18, the N-type transistors NT13 and NT15 having the reference voltage (bias voltage) VB1 connected to gate electrodes thereof and the P-type transistors PT23 and PT25 having the reference voltage (bias voltage) VB2 connected to gate electrodes thereof respectively correspond to the current sources IS11, IS12, IS21 and IS22 in FIG. 8 and FIG. 9. Further, RP indicates a resistance for protecting an output of the operational amplifier circuit from static electricity.

4.1 ON/OFF Control of Current Sources

In this embodiment, using the transistors NT14, NT16, PT24 and PT26 shown in FIG. 18, the ON/OFF control of the current sources IS11 (NT13), IS12 (NT15), IS21 (PT23) and IS22 (PT25) of the operational amplifiers OP1 and OP2 is performed so as to realize the ON/OFF control of the operations of the operational amplifiers.

Here, signals OFF1D and OFF1Q are connected to the gate electrodes of the N-type transistors NT14 and NT16, while signals XOFF2D and XOFF2Q are connected to the gate electrodes of the P-type transistors PT24 and PT26. Then, these signals OFF1D, OFF1Q, XOFF2D and XOFF2Q are subjected to a signal control as shown in a timing waveform chart in FIG. 19A, for example. Here, 'X' of the signals XOFF2D and XOFF2Q means "negative logic".

For example, during the period T1 (first period) in which the counter electrode VCOM becomes VC1, the signals OFF1D and OFF1Q become H level (active) and the N-type transistors NT14 and NT16 in FIG. 18 are turned on. Accordingly, the current flows into the current sources IS11 (NT13) and IS12 (NT15) of the operational amplifier OP1 so that the operational amplifier OP1 is in the operable state.

Further, during this period T1, the signals XOFF2D and XOFF2Q become H level (non-active) and the P-type transistors PT24 and PT26 are turned off. Accordingly, the current which flows into the current sources IS21 (PT23) and IS22 (PT25) of the operational amplifier OP2 is cut off so that the operational amplifier OP2 is in the inoperable state.

In this manner, during the period T1, while the operational amplifier OP1 is set to the operable state, the operational amplifier OP2 is set to the inoperable state and hence, the power consumption can be lowered. That is, compared to a case in which both of the operational amplifiers OP1 and OP2 are set to the operable state, the power consumption can be halved. Then, during the period T1, only the output of the operational amplifier OP1 is selected by the selection circuit 70 and the data line S is driven only by the operational amplifier OP1. Accordingly, even when the operational amplifier OP2 becomes the inoperable state during the period T1, there arises no problem with respect to the driving of the data line S.

During the period T2 (second period) in which the counter electrode VCOM becomes VC2, the signals OFF1D and OFF1Q become L level (non-active) and the N-type transistors NT14 and NT16 in FIG. 18 are cut off. Accordingly, the current flows into the current sources IS11 and IS12 of the operational amplifier OP1 so that the operational amplifier OP2 becomes the inoperable state.

Further, during this period T2, the signals XOFF2D and XOFF2Q become L level (active) and the P-type transistors PT24 and PT26 are turned on. Accordingly, the current flows into the current sources IS21 and IS22 of the operational amplifier OP2 so that the operational amplifier OP2 are in the operable state.

In this manner, during the period T2, while the operational amplifier OP2 is set to the operable state, the operational amplifier OP1 is set to the inoperable state and hence, the power consumption can be lowered. That is, compared to a case in which both of the operational amplifiers OP1 and OP2 are set to the operable state, the power consumption can be halved. Then, during the period T2, only the output of the operational amplifier OP2 is selected by the selection circuit 70 and the data line S is driven only by the operational amplifier OP2. Accordingly, even when the operational amplifier OP1 becomes the inoperable state during the period T2, there arises no problem with respect to the driving of the data line S.

In this manner, according to this embodiment, with the provision of the transistors NT14, NT16, PT24 and PT26 which are controlled in response to the signals OFF1D, OFF1Q, XOFF2D and XOFF2Q, the current sources of the operational amplifier which is not used can be turned off thus succeeding in the lowering of the power consumption of the operational amplifier circuit.

Figure 19A:
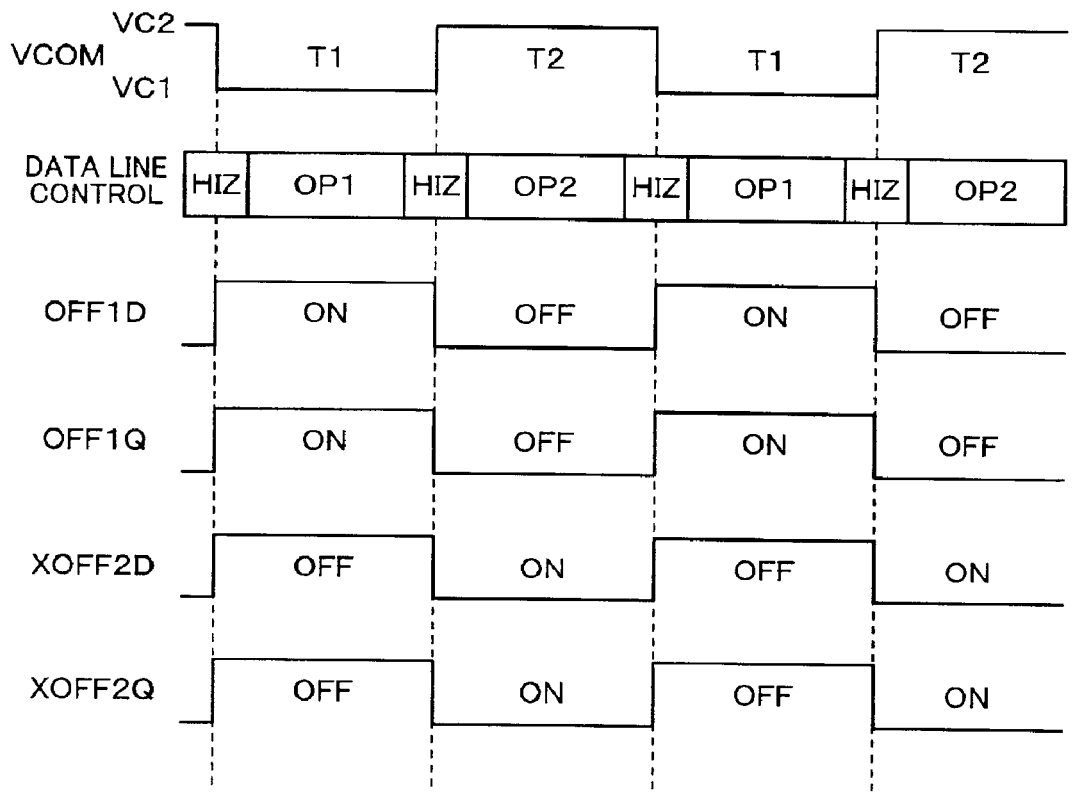
FIG. 19A and FIG. 19B are timing waveform charts describing a method of performing an ON/OFF control of a current source of the operational amplifier circuit.
Figure 19B:
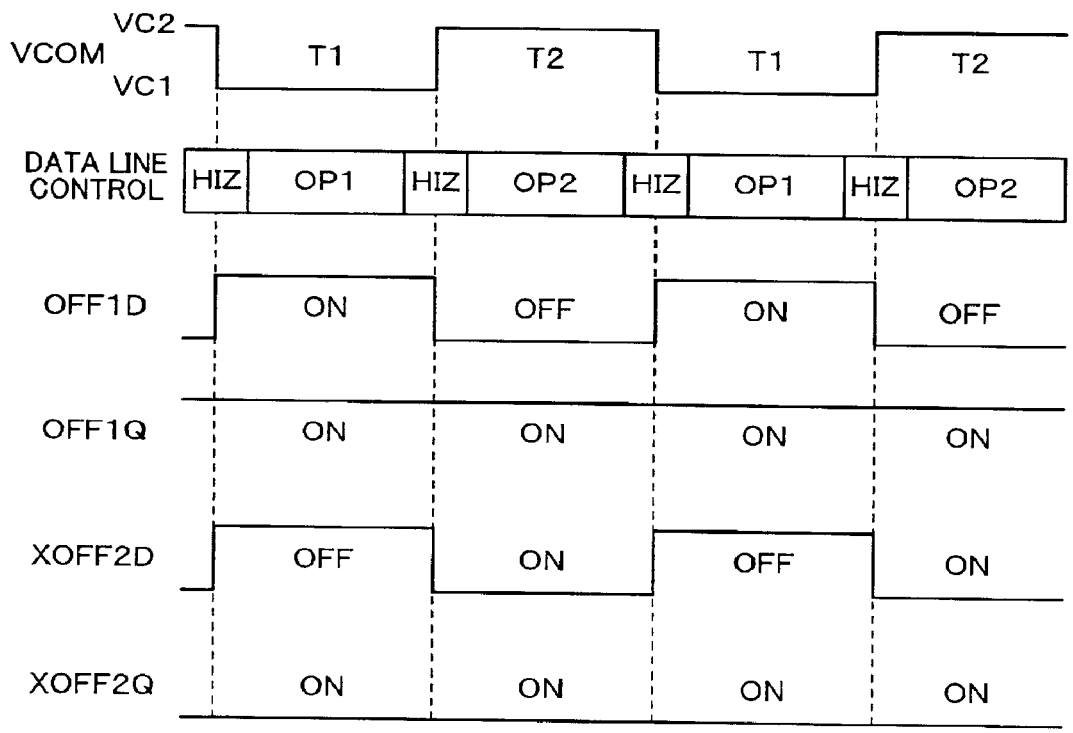

Here, the signals OFF1D, OFF1Q, XOFF2D and XOFF2Q may be subjected to a signal control shown in a timing waveform chart in FIG. 19B.

That is, in FIG. 19B, although the signals OFF1D and XOFF2D are changed in response to the changeover of the periods T1 and T2, the signals OFF1Q and XOFF2Q are not changed in response to the changeover of the periods T1 and T2. Here, while the signal OFF1Q is fixed to the H level, the signal XOFF2Q is fixed to the L level.

Then, by changing the signals OFF1D and XOFF2D, the current sources IS11 and IS22 which the differential sections of the operational amplifiers OP1 and OP2 in FIG. 18 include are subjected to the ON/OFF control.

On the other hand, by fixing the signals OFF1Q and XOFF2Q to the H level and L level, the current sources IS12 and IS22 which the output sections of the operational amplifiers OP1 and OP2 are always in the ON state.

For example, when the electric current which flows in the current sources IS11 and IS21 of the differential section of the operational amplifier is large, the response speed and the frequency characteristics of the operational amplifier can be enhanced so that the current is large in general. Accordingly, by performing the ON/OFF control of the current which flows in the current sources IS11 and IS21, the more effective lowering of power consumption can be realized.

On the other hand, as has been described in conjunction with B5, B15 in FIG. 17, in this embodiment, the current supply ability (driving ability) is not required so much with respect to the current sources IS12 and IS22 of the output section of the operational amplifier. Accordingly, even when the current which flows in the current sources IS12 and IS22 is not subjected to the ON/OFF control but is always allowed to flow into the current sources IS12 and IS22, the transistors PT13 and NT23 are turned off through the transistors PT14 and NT24 in response to the signals SEL1, SEL2 and hence, the power consumption is not increased so much. Then, by allowing the electric current to always flow in the current sources IS12 and IS22, the voltage levels of the outputs Q1 and Q2 of the operational amplifiers OP1 and OP2 can be made stable and the voltage levels of the outputs Q1 and Q2 can be set to L level (VSS) and H level (VDD) when the driving transistors PT13 and NT23 are in the OFF state. Accordingly, as will be described later, a problem which may arise due to a phenomenon that the voltage level of the outputs Q1, Q2 becomes unstable can be effectively prevented.

Although the control is performed so as to cut off the electric current which flows in the current sources IS11, IS12, IS21 and IS22 in FIG. 19A and FIG. 19B, the control may be performed so as to restrict or decrease the electric current without completely cutting off the current.

4.2 ON/OFF Control of Driving Transistors

In this embodiment, the ON/OFF control of the driving transistors PT13 and NT23 of the operational amplifiers OP1 and OP2 is performed using the transistors PT14 and NT24 shown in FIG. 18 thus preventing the outputs Q1 and Q2 of the operational amplifiers OP1 and OP2 from becoming unstable.

Here, the signal SEL1 is connected to the gate electrode of the P-type transistor PT14. This signal SEL1 is a signal which is also used for the ON/OFF control of the transfer gate TG1 and instructs the selection/non-selection of the operational amplifier OP1 (see FIG. 11A and FIG. 11B).

Further, an inversion signal of the signal SEL2 is connected to the gate electrode of the N-type transistor NT24. This signal SEL2 is a signal which is also used for the ON/OFF control of the transfer gate TG2 and instructs the selection/non-selection of the operational amplifier OP2.

Figure 20:
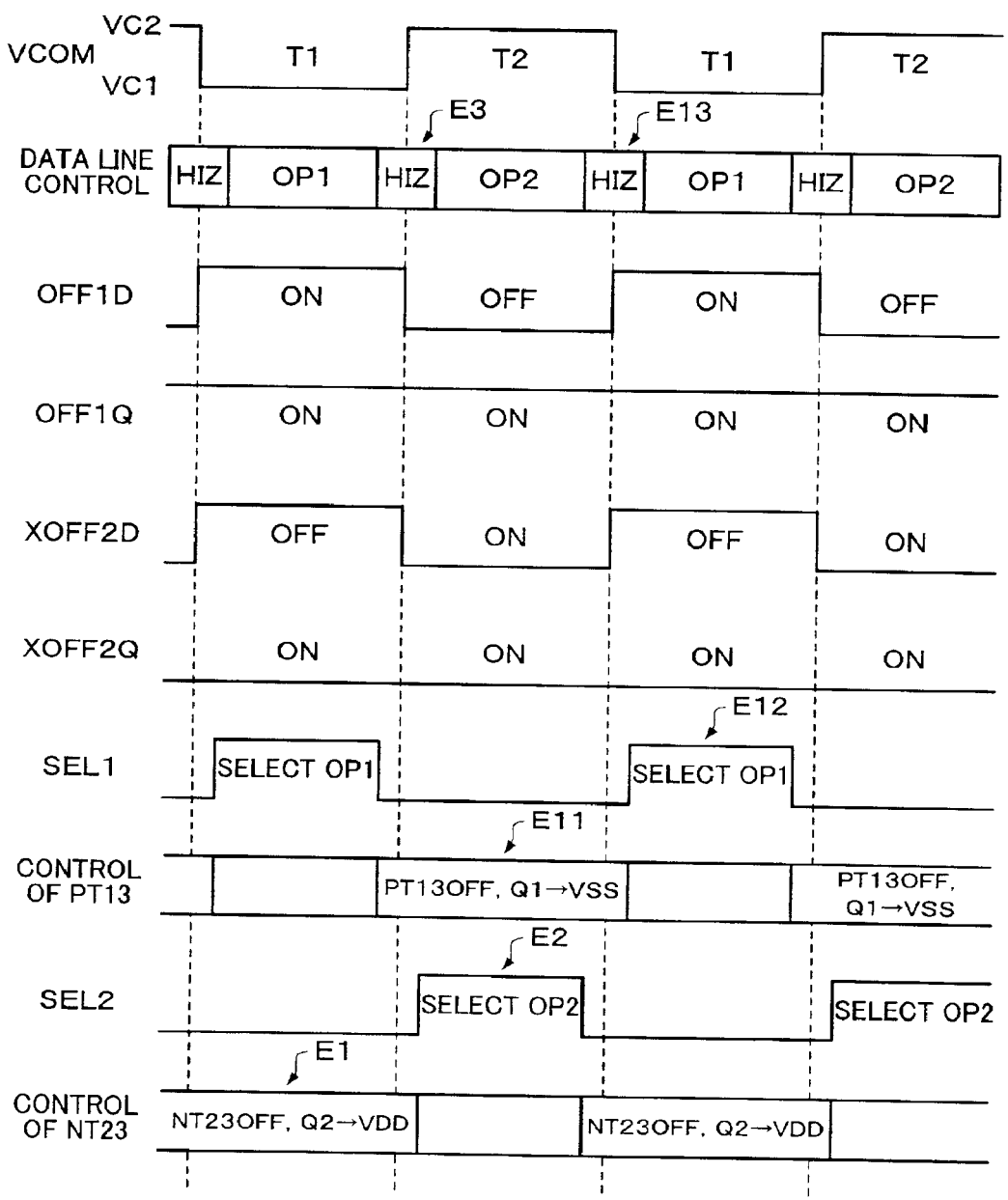
FIG. 20 is a timing waveform chart describing a method of performing an ON/OFF control of a driving transistor.

These signals SEL1 and SEL2 are subjected to a signal control as shown in a timing waveform chart in FIG. 20, for example.

For example, during the period T1 in which the counter electrode VCOM becomes VC1, the signal SEL1 becomes H level (active) and the transfer gate TG1 in FIG. 18 is turned on. Accordingly, the operational amplifier OP1 is selected and the output Q1 is connected to the data line S.

On the other hand, during the period T1, the signal SEL2 becomes L level (non-active) and the N-type transistor NT24 to which the inversion signal of the signal SEL2 is inputted is turned on. Accordingly, the signal XDQ2 which is connected to the gate electrode of the driving transistor NT23 becomes L level so that the driving transistor NT23 is turned off. Accordingly, the voltage level of the output Q2 of the operational amplifier OP2 is pulled toward the VDD side due to the current source IS22 and is set to H level. That is, during the period T1 during which the operational amplifier OP2 is in the inoperable state, it is possible to prevent the voltage level of the output Q2 of the operational amplifier OP2 from becoming unstable.

Further, during the period T2 in which the counter electrode VCOM becomes VC2, the signal SEL2 becomes H level (active) and the transfer gate TG2 in FIG. 18 is turned on. Accordingly, the operational amplifier OP2 is selected and the output Q2 is connected to the data line S.

On the other hand, during the period T2, the signal SEL1 becomes L level (non-active) and the P-type transistor NT14 to which the signal SEL1 is inputted is turned on. Accordingly, the signal XDQ1 which is connected to the gate electrode of the driving transistor PT13 becomes H level so that the driving transistor PT23 is turned off. Accordingly, the voltage level of the output Q1 of the operational amplifier OP1 is pulled toward the VSS side due to the current source IS12 and is set to L level. That is, during the period T2 in which the operational amplifier OP1 is in the inoperable state, it is possible to prevent the voltage level of the output Q1 of the operational amplifier OP1 from becoming unstable.

As described above, according to this embodiment, during the period before the operational amplifier OP2 is selected and the operational amplifier OP2 drives the data line S, as indicated by E1 in FIG. 20, the gate electrode of the driving transistor NT23 which the operational amplifier OP2 includes becomes L level so that the driving transistor NT23 is turned off. Since the current source IS22 is always in the ON state at this point of time, the voltage level of the output Q2 of the operational amplifier OP2 is changed to the VDD side and becomes H level.

Accordingly, even when the transfer gate TG2 is turned on based on the selection of the operational amplifier OP2 as indicated by E2 in FIG. 20 thereafter, the adverse influence which may be caused by the redistribution of charge can be minimized.

That is, in this embodiment, before driving the data line S using the operational amplifier OP2, the data line S (output of the operational amplifier circuit) is set to the high impedance state as indicated by E3 in FIG. 20. Then, by changing the counter electrode VCOM from VC1 to VC2 in this high impedance state, the voltage level of the data line S is elevated as described in conjunction with B3 in FIG. 17.

However, assuming a case in which the output Q2 of the operational amplifier OP2 becomes L level when the transfer gate TG2 shown in FIG. 18 is turned on, the voltage level of the data line S which is once elevated as indicated by B3 in FIG. 17 is lowered due to the redistribution of charge. This gives rise to a phenomenon in which the subsequent driving of the data line by the operational amplifier OP2 is hindered.

According to this embodiment, during the period before the data line S is driven by the operational amplifier OP2, the driving transistor NT23 of the operational amplifier OP2 is turned off as indicated by E1 in FIG. 20 and the output Q2 of the operational amplifier OP2 becomes H level and hence, the adverse influence caused by the redistribution of charge can be minimized thus preventing the above-mentioned phenomenon.

In the same manner, according to this embodiment, during the period before the operational amplifier OP1 is selected and the operational amplifier OP1 drives the data line S, as indicated by E11 in FIG. 20, the gate electrode of the driving transistor PT13 which the operational amplifier OP1 includes becomes H level so that the driving transistor PT13 is turned off. Since the current source IS12 is always in the ON state at this point of time, the voltage level of the output Q1 of the operational amplifier OP1 is changed to the VSS side and becomes L level.

Accordingly, even when the transfer gate TG1 is turned on in response to the selection of the operational amplifier OP1 as indicated by E12 in FIG. 20 thereafter, the adverse influence which may be caused by the redistribution of charge can be minimized.

That is, in this embodiment, before driving the data line S using the operational amplifier OP1, the data line S is set to the high impedance state as indicated by E13 in FIG. 20. Then, by changing the voltage level of the counter electrode VCOM from VC2 to VC1 in this high impedance state, the voltage level of the data line S is lowered as described in conjunction with B13 in FIG. 17.

However, assuming a case in which the output Q1 of the operational amplifier OP1 becomes H level when the transfer gate TG1 shown in FIG. 18 is turned on, the voltage level of the data line S which is once lowered as indicated by B13 in FIG. 17 is elevated due to the redistribution of charge. This gives rise to a phenomenon in which the subsequent driving of the data line by the operational amplifier OP1 is hindered.

According to this embodiment, during the period before the data line S is driven by the operational amplifier OP1, the driving transistor PT13 of the operational amplifier OP1 is turned off as indicated by E11 in FIG. 20 and the output Q2 of the operational amplifier OP1 becomes L level and hence, the adverse influence caused by the redistribution of charge can be minimized thus preventing the above-mentioned phenomenon.

5. Clamp Circuit

Figure 21A:
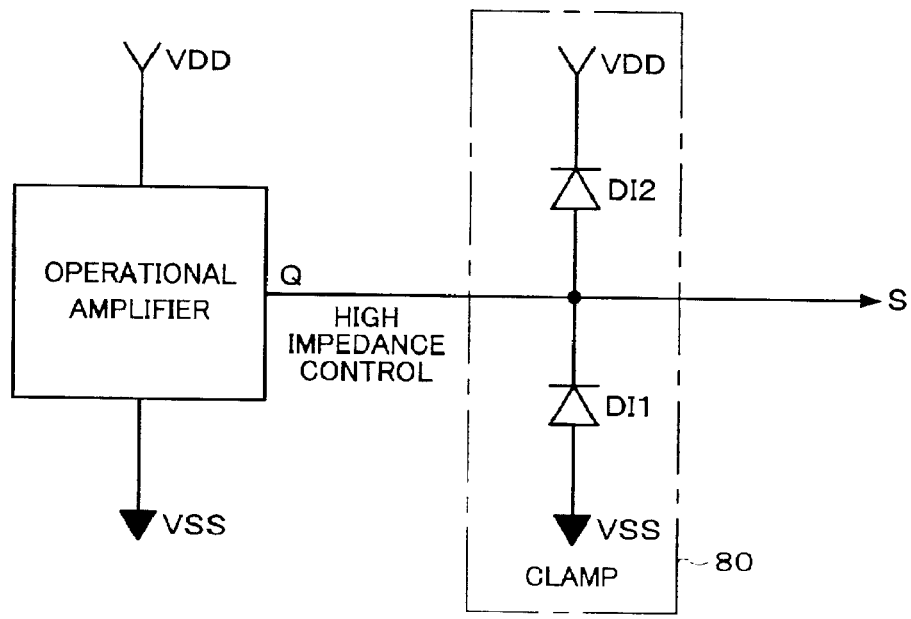
FIG. 21A, FIG. 21B and FIG. 21C are diagrams describing a method of providing a clamp circuit to an output of the operational amplifier circuit.

Here, to further lower the power consumption of the liquid crystal device, as shown in FIG. 21A, this embodiment performs a high impedance control of the output Q of the operational amplifier circuit and provides a clamp circuit 80 to the output Q. With the provision of this clamp circuit 80, the output Q (data line S) of the operational amplifier circuit is clamped in a voltage range equal to or wider than a voltage range between the power sources VDD, VSS of the operational amplifier circuit. Accordingly, it is possible to return the excessive charge to the power source VDD side or the power source VSS side so that the power consumption of the liquid crystal device can be lowered.

As shown in FIG. 21A, the clamp circuit 80 includes a diode DI1 (clamp element) which is inserted between the power source VSS (second power source) and the data line S and a diode DI2 which is inserted between the data line S and the power source VDD (first power source). Here, the diode DI1 is a diode which sets the direction advancing from the power source VSS to the data line S as the forward direction and the diode DI2 is a diode which sets the direction advancing from the data line S to the power source VDD as the forward direction.

Figure 21B:
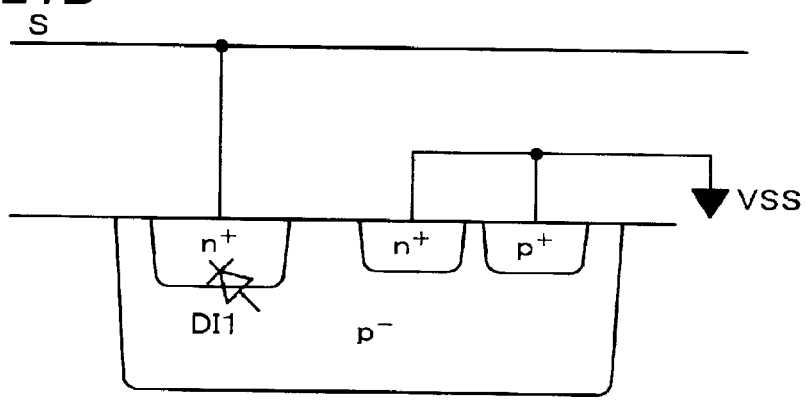

FIG. 21B shows an example of the element structure of the diode DI1 provided to the VSS side. As shown in FIG. 21B, the diode DI1 uses a p well region p− which is connected to the power source VSS through an active region p+ as a positive-polarity-side electrode and an active region n+ as a negative-polarity-side electrode.

Figure 21C:
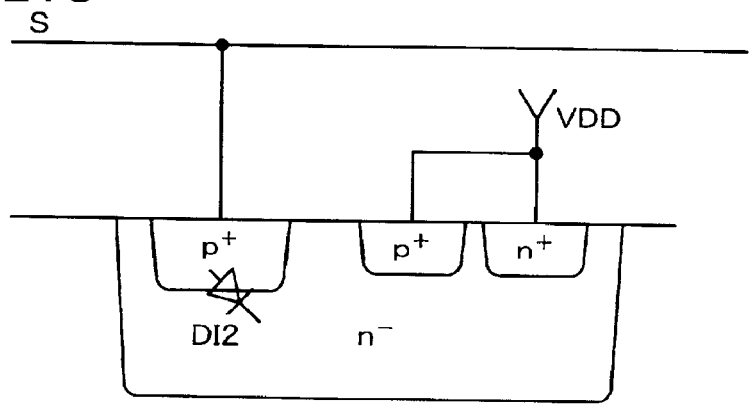

FIG. 21C shows an example of the element structure of the diode DI2 provided to the VDD side. As shown in FIG. 21C, the diode DI2 uses an active region p+ as a positive-polarity-side electrode and an n well region n− which is connected to the power source VDD through an active region n+ as a negative-polarity-side electrode.

These diodes DI1 and DI2 can be also used as protective circuits for the operational amplifier circuit. More specifically, these diodes DI1 and DI2 may be incorporated into an I/O circuit (I/O pad) of a semiconductor device in which the operational amplifier circuit (driving circuit) is formed.

Here, without providing the diodes to both of the VDD side and the VSS side, the diode may be provided to only one side. Further, the output transistors (transfer gates TG1 and TG2 in FIG. 18, for example) of the operational amplifier circuit may be used as the diodes DI1 and DI2 (clamp circuit).

Subsequently, the principle of the method of lowering the power consumption with the provision of the clamp circuit 80 shown in FIG. 21A is described. Here, to simplify the explanation, the explanation is made hereinafter assuming that the power sources VSS, VDD are set to 0V, 5V and VC1 and VC2 of the counter electrode VCOM are also set to 0V and 5V.

Figure 22A:
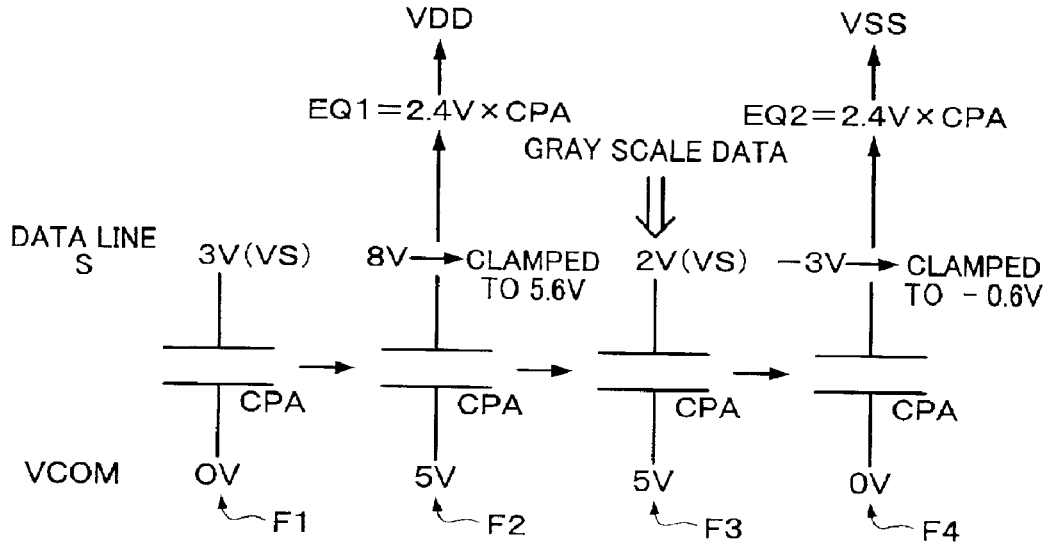
FIG. 22A, FIG. 22B and FIG. 22C are diagrams describing a method of lowering the power consumption by providing the clamp circuit.

For example, assume that the written voltage VS (gray scale voltage) of the data line S is 3V when the counter electrode VCOM is 0V as indicated by F1 in FIG. 22A. Further, assume that the counter electrode VCOM is changed from 0V (VC1) to 5V (VC2) as indicated by F1 and F2 in FIG. 22A in this state. At this point of time, in this embodiment, since the output of the operational amplifier circuit is set to the high impedance state (see FIG. 10 to FIG. 11B), due to the parasitic capacitance CPA generated between the counter electrode VCOM and the data line S (see FIG. 16), the data line S is going to be changed from 3V (VS) to VS+VC2=8V.

However, in this embodiment, the clamp circuit 80 is provided to the output of the operational amplifier circuit as shown in FIG. 21A. Accordingly, even when the data line S is going to be changed to 8V, the voltage of 8V is clamped by the clamp circuit 80 thus resulting in VDD+0.6V=5.6 V. Here, 0.6V is the forward direction voltage of PN junction of the diode.

Then, when the voltage of 8V is changed to 5.6V by clamping, the charge of EQ1=(8V−5.6V)×CPA is returned to the power source VDD side and is utilized again for performing the operation of the operational amplifier circuit included in the driving circuit. That is, the energy which is used for changing the counter electrode VCOM of the display panel is not wasted but is returned to the power source and is reused so that the power consumption can be lowered.

Further, even when the voltage level of the data line S (output Q of the operational amplifier circuit) is lowered from 8V to 5.6V, this voltage level is still sufficiently higher than the gray scale voltage (0 to 5V). Accordingly, this voltage level does not hinder the data line driving method of this embodiment which has been described in conjunction with B3, B5, B13 and B15 in FIG. 17.

Then, assume that the written voltage VS (gray scale voltage) of 2V is written in the data line S in the state that the counter electrode VCOM is 5V as indicated by F3 in FIG. 22A. Further, assume that the counter electrode VCOM is changed from 5V (VC2) to 0V (VC1) as indicated by F3 and F4 in FIG. 22A. At this point of time, in this embodiment, since the output of the operational amplifier circuit is set to the high impedance state, due to the parasitic capacitance CPA between the counter electrode VCOM and the data line S, the data line S is going to be changed from 2V to −3V.

However, in this embodiment, the clamp circuit 80 is provided to the output of the operational amplifier circuit as shown in FIG. 21A. Accordingly, even when the data line S is going to be changed to −3V, the voltage of −3V is clamped by the clamp circuit 80 thus resulting in VSS−0.6V=−0.6 V.

Then, when the voltage of −3V is changed to −0.6V by clamping, the charge of EQ2={−6−(−3V)}×CPA is returned to the power source VSS side and is utilized again so that the power consumption can be lowered.

Figure 22B:
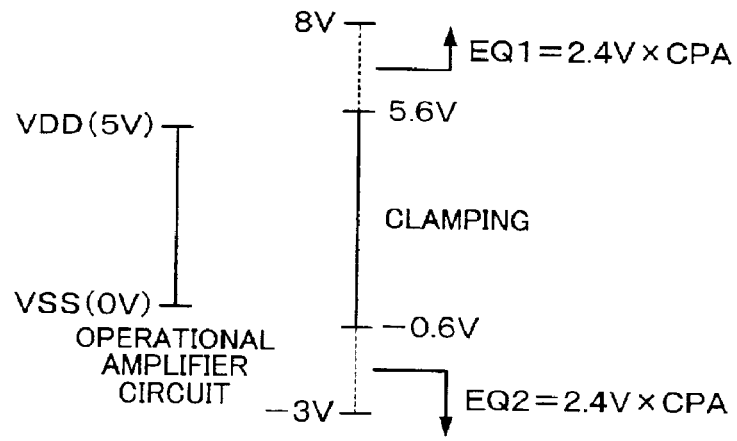

As described above, in this embodiment, to change the voltage level of the data line S using the parasitic capacitance CPA, the output of the operational amplifier circuit is set to the high impedance state when the counter electrode VCOM is changed over. Then, as shown in FIG. 22B, the output of the operational amplifier circuit is clamped to the voltage range (5.6V to −0.6V) which is equal to or wider than the voltage level (5V to 0V) between the power sources VDD and VSS of the operational amplifier circuit. Accordingly, the charges EQ1=2.4V×CPA, EQ2=2.4V×CPA which become excessive due to these clamping operations are returned to the power sources VDD and VSS so that the power consumption of the liquid crystal device can be lowered.

Here, to facilitate the return of the charge at the time of clamping, it is desirable that the power source for the operational amplifier circuit and the power source for the clamp circuit are provided as circuits different from each other.

Figure 22C:
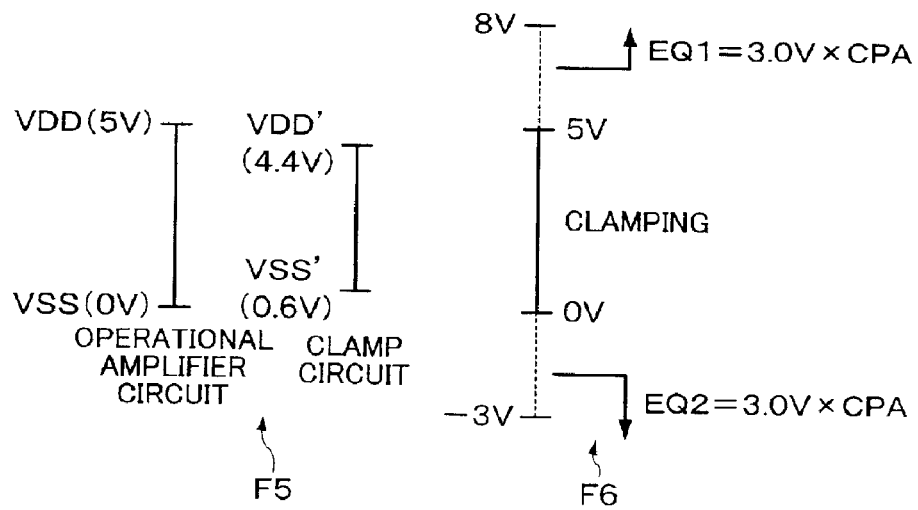

More specifically, as indicated by F5 in FIG. 22C, when the power sources of the operational amplifier circuit are constituted of power sources VDD and VSS (first and second power sources) and the power sources of the clamp circuit are constituted of power sources VDD' and VSS' (third and fourth power sources), the relationship VDD−VSS>VDD'−VSS' is established. That is, the voltage range of the power sources VDD' and VSS' of the clamp circuit is set narrower than the voltage range of the power sources VDD and VSS of the operational amplifier circuit. For example, when the voltage range of VDD and VSS is 5V to 0V, the voltage range of VDD' and VSS' is set to 4.4V to 0.6V.

In this configuration, as indicated by F6 in FIG. 22C, it is possible to increase the charge which can be returned to the power source sides compared to FIG. 22B. For example, while the charge of EQ1=EQ2=2.4V×CPA is returned to the power source side in FIG. 22B, the charge of EQ1=EQ2=3.0V×CPA is returned to the power source side in FIG. 22C. Accordingly, the charge which is returned to the power source side can be increased so that the further lowering of the power consumption of the liquid crystal device can be realized.

The power sources VDD' and VSS' of the clamp circuit can be generated by utilizing the voltage generation function (gray scale voltage generation function) of the power source circuit 42 in FIG. 1.

Further, when the forward voltage of the diode is set to VBD, it is desirable that the relationship VDD'≧VDD−VBD, VSS'≦VSS+VBD is established. For example, when the voltage VDD is 5V and the voltage VSS is 0V, the relationship VDD'>4.4V, VSS'<0.6V is established.

In this configuration, a phenomenon that the driving current of the operational amplifier circuit flows in the power sources VDD' and VSS' of the clamp circuit at the time of driving the data line using the operational amplifier circuit can be prevented. Accordingly, the proper data line driving of the operational amplifier circuit can be realized.

The power consumption lowering method which includes setting the output of the operational amplifier circuit to the high impedance state when the voltage level of the counter electrode VCOM is changed over and providing the clamp circuit to the output of the operational amplifier circuit is also effectively applicable to the AB class operational amplifier circuit shown in FIG. 6. That is, also with respect to the AB class operational amplifier circuit, the excessive charge can be returned to the power source side and the power consumption can be lowered by an amount corresponding to the excessive charge.

6. Virtual Scanning Period

Figure 23:
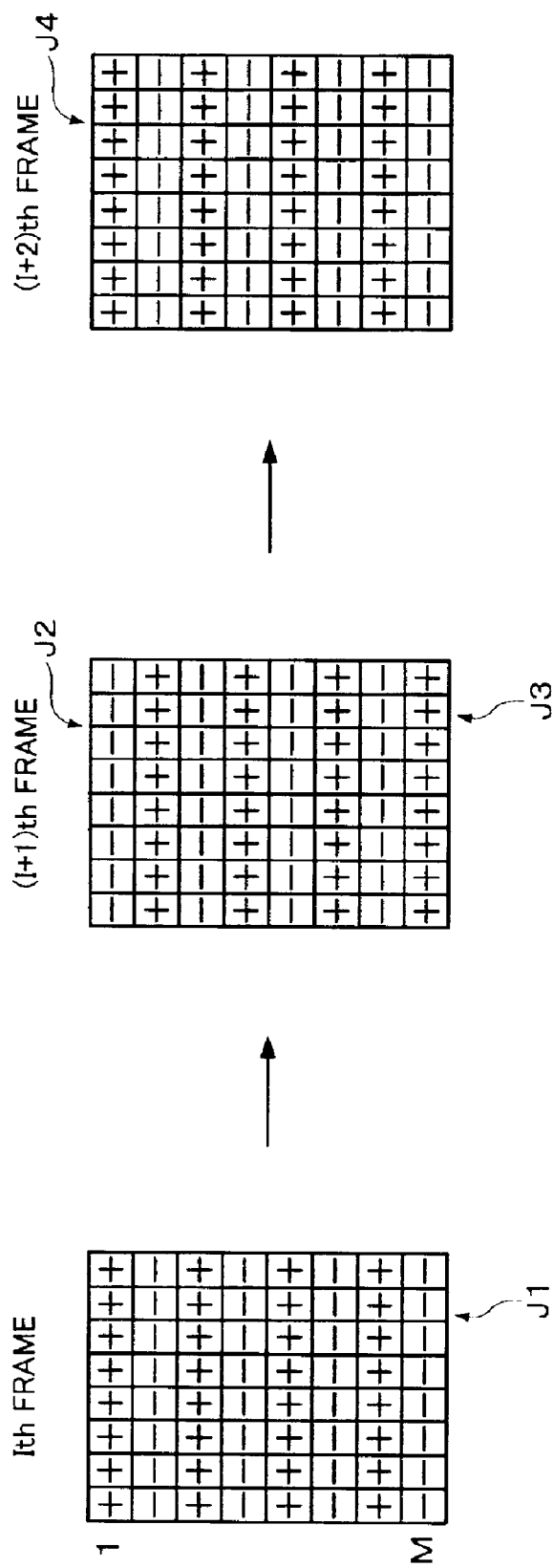
FIG. 23 is a diagram describing the scan line inversion driving.

In the scanning (gate) line inversion driving which has been described in conjunction with FIG. 4, as shown in FIG. 23, the polarity of voltage applied to the liquid crystal element is inverted every scanning period (scan line) and is also inverted every frame. Accordingly, it is possible to prevent the phenomenon that the direct current voltage is applied to the liquid display element for a long time so that the deterioration of the liquid crystal element can be prevented.

In such a scan line inversion driving, when the number M of the scan lines is an even number (228 pieces, for example), as indicated by J1, J2, J3 and J4 in FIG. 23, the polarity of the applied voltage in the final Mth scanning period becomes equal to the polarity of the applied voltage in the first scanning period of the next frame. For example, at J1 and J2 in FIG. 23, both of these polarities become negative polarities and at J3 and J4 in FIG. 23, both of these polarities become positive polarities.

Accordingly, when the display panel having the even number M of scan lines is driven by the driving method of this embodiment shown in FIG. 17, it has been found that following problems arise.

Figure 24:
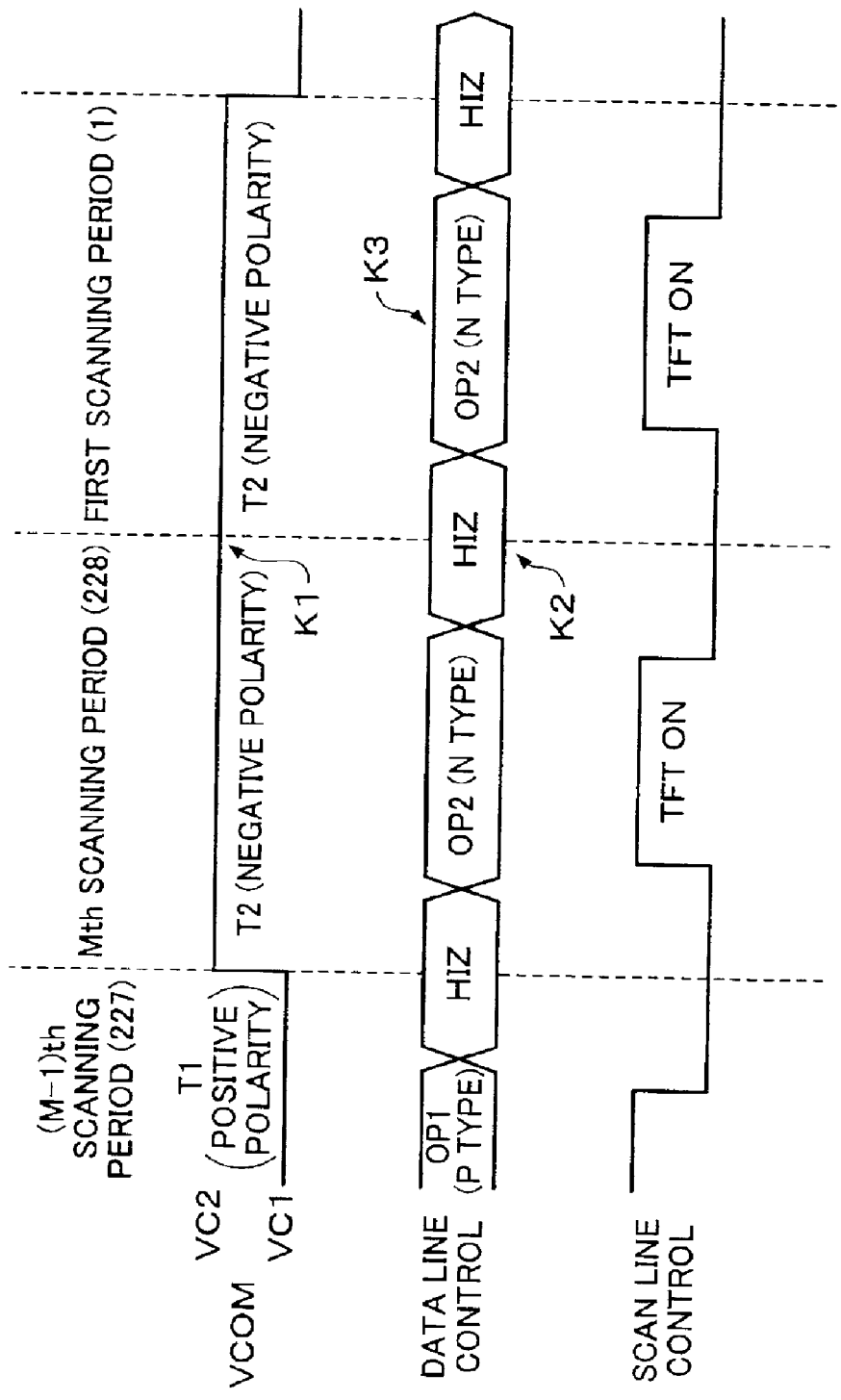
FIG. 24 is a timing waveform chart describing problems when an virtual scanning period is not provided.

For example, in the (M−1) th scanning period (the period in which the (M−1)th scan line is selected) as shown in FIG. 24, VCOM becomes VC1 and VC1 is lower than the gray scale voltage and hence, the (M−1)th scanning period becomes the period T1 in which the voltage applied to the liquid crystal element has the positive polarity. Further, in the final Mth scanning period (the period in which the Mth scan line is selected), VCOM becomes VC2 and VC2 is higher than the gray scale voltage and hence, the Mth scanning period becomes the period T2 in which the voltage applied to the liquid crystal element has the negative polarity. Further, in the first scanning period (the period in which the first scan line is selected) of the next frame, VCOM becomes VC1 and hence, the first scanning period becomes the period T2 in which the voltage applied to the liquid crystal element has the negative polarity.

That is, in FIG. 24, both of the Mth scanning period and the first scanning period of the next frame are periods T of negative polarity and hence, even when the scanning period is changed from the Mth scanning period to the first scanning period, VCOM is held at VC2 as indicated by K1 and the polarity is not inverted. Further, in the Mth scanning period as well as in the first scanning period, the data line is driven by the N-type operational amplifier OP2.

In this manner, since VCOM per se are not subjected to the inversion of polarity at K1 in FIG. 24, even when the output of the operational amplifier circuit becomes the high impedance state as indicated by K2, the voltage level of the data line S is not changed. That is, although the voltage level of the data line is changed to the VSS side as indicated by B13 since VCOM are subjected to the inversion of polarity at B11 in FIG. 17, the voltage level of the data line is not changed with respect to K1 in FIG. 24.

Accordingly, in the subsequent first scanning period, the direction that the voltage level of the data line is changed depends on the gray scale level (see A1 to A4 in FIG. 5) and it is difficult to specify the direction to one direction. Accordingly, when the data line is driven by the N-type operational amplifier OP2 as indicated by K3 in FIG. 24 in the first scanning period, there arises a case in which it is necessary to spend a long time until the voltage level of the data line is set to the voltage level corresponding to the gray scale level. This is because that when the direction that the voltage level of the data line is changed is set to the VDD side, it is necessary to drive the data line using the current source IS22 in FIG. 9 which exhibits the low current supply ability.

Accordingly, in this embodiment, a method which inserts a virtual (dummy) scanning period between the Mth scanning period and the first scanning period is adopted.

More specifically, first of all, as a presumption, the display panel (electro-optical device) is driven by the scan line inversion driving (inversion driving which sets the voltage level of the counter electrode VCOM during the scanning period to the voltage level which is different from the voltage level of the preceding scanning period) shown in FIG. 23.

Figure 25:
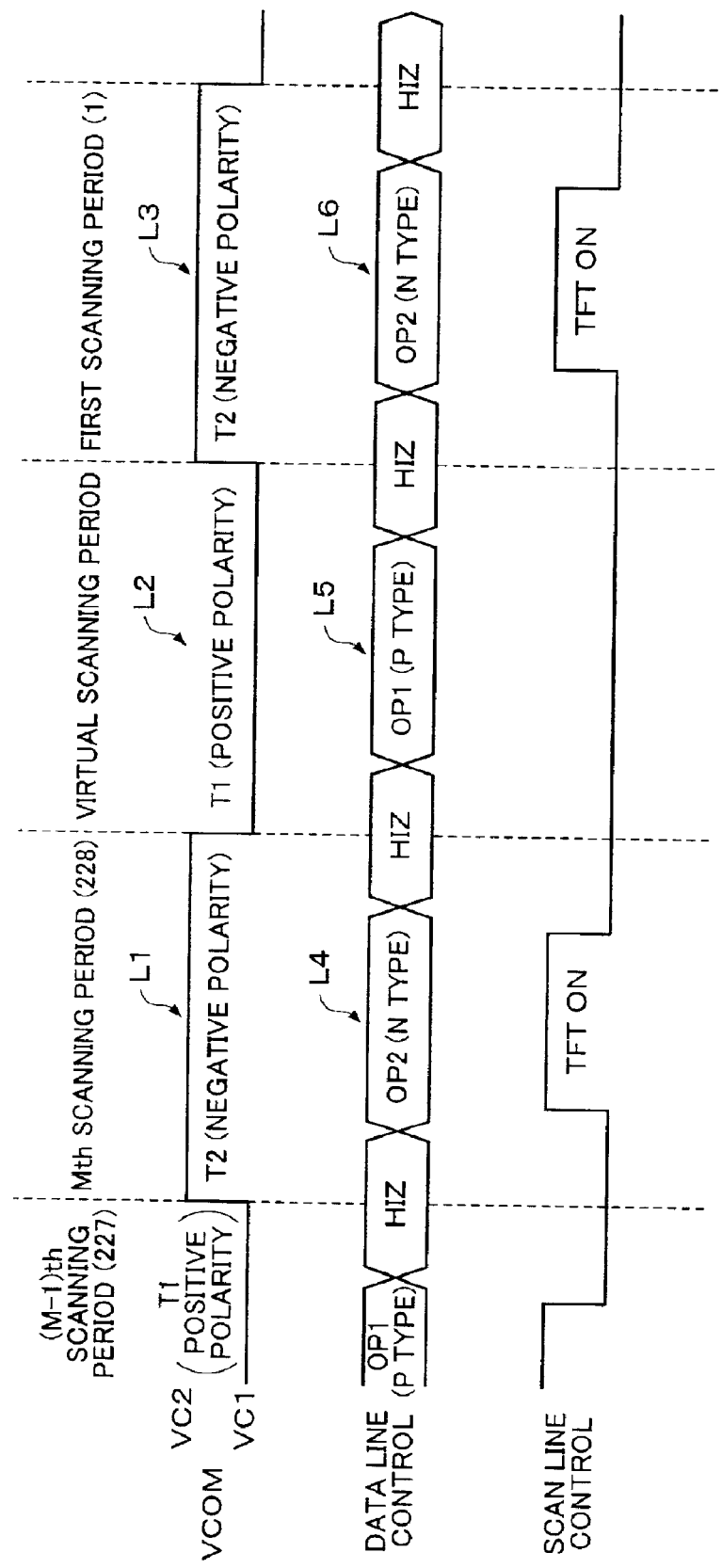
FIG. 25 is a timing waveform chart describing a method of providing a virtual scanning period.

Then, as indicated by L1 in FIG. 25, during the Mth (M being an even number) scanning period, the driving is performed while setting VCOM to VC2 (either one voltage level of VC1 and VC2 in a broad sense).

Subsequently, as indicated by L2 in FIG. 25, the virtual (dummy) scanning period is provided next to the Mth scanning period. During this virtual scanning period, the driving is performed while setting VCOM to VC1 (the other voltage level different from the above-mentioned one voltage level in a broad sense). That is, the counter electrode VCOM is subjected to the inversion of polarity.

Subsequently, as indicated by L3 in FIG. 25, during the first scanning period next to the virtual scanning period, the driving is performed while setting VCOM to VC2 (the above-mentioned one voltage level in a broad sense).

Further, in response to the changeover of the voltage level of the counter electrode VCOM, as indicated by L4, L5, L6 in FIG. 25, the operational amplifier is changed over from the operational amplifier OP1 (P type) to the operational amplifier OP2 (N type), from the operational amplifier OP2 to the operational amplifier OP1, and from the operational amplifier OP1 (P type) to the operational amplifier OP2 (N type) sequentially. That is, the driving is performed during the scanning period using the operational amplifier different from the operational amplifier used in the preceding scanning period.

Further, at the time of the changeover of the voltage level of the counter electrode VCOM, the output (data line) of the operational amplifier circuit is set to the high impedance state.

Due to such operations, although the counter electrode VCOM is not subjected to the inversion of polarity at K1 in FIG. 24, VCOM is always subjected to the inversion of polarity as indicated by L1, L2 and L3 in FIG. 25. Accordingly, it is possible to change the voltage level of the data line before driving by positively utilizing the parasitic capacitance CPA as indicated by B3 and B13 in FIG. 17. As a result, as indicated by B5 and B15 in FIG. 17, it is possible to specify the changing direction of the voltage level to one direction without depending on the gray scale level and hence, the A class operational amplifiers OP1 and OP2 with small power consumption can be used. As a result, the lowering of the power consumption of the liquid crystal device can be enhanced.

In the virtual scanning period shown in FIG. 25, the data line is driven using the operational amplifier corresponding to the polarity of the period. For example, the virtual scanning period is the period T1 of positive polarity at L2 in FIG. 25 and hence, the data line is driven using the P-type operational amplifier OP1 which has the high ability to change the voltage level to the VDD side. On the other hand, when the virtual scanning period is the period T2 of negative polarity, the data line is driven using the N-type operational amplifier OP2 having the high ability to change the voltage level to the VSS side.

Further, in the virtual scanning period, the scan line driving circuit 30 shown in FIG. 1 does not drive the scan lines G1 to GM but performs the virtual driving of virtual scan lines.

More specifically, when the number M of the scan lines is 228, for example, the controller 40 shown in FIG. 1 inputs the enable input/output signal EIO shown in FIG. 3 to the shift resister 32 not every 228 scanning period but every 229 scanning period. Due to such an operation, during the virtual scanning period which comes next to the Mth scanning period, the enable input/output signal EIO is not present in the shift resister 32 so that the driving of the actual scan lines is not performed.

Here, the method which provides the virtual scanning periods as shown in FIG. 25 is also applicable to a driving method in which one frame is divided into a plurality of driving fields.

Further, the method shown in FIG. 25 is also applicable to a driving method in which an additional transistor (precharge transistor, for example) is provided to the output of the operational amplifier circuit and the voltage level of the data line is changed before driving.

Here, the present invention is not limited to this embodiment and various modifications are conceivable within the scope of the spirit of the present invention.

For example, although the embodiment has been described in conjunction with the case in which the present invention is applied to the active matrix type liquid crystal device using the TFT, the liquid crystal device to which the present invention is applicable is not limited to such a liquid crystal device.

Further, the configuration of the operational amplifier circuit is not limited to the configuration which has been described in this embodiment.

Further, the present invention is not limited to the liquid crystal device (LCD panel) and is also applicable to an electro-luminescence (EL) device, an organic EL device and a plasma display device.

Further, the present invention is not limited to the scan line inversion driving and is also applicable to other inversion driving methods.

Still further, with respect to the inventions according to dependent claims among the present inventions, a portion of constituent elements of dependent claims can be omitted. Further, an essential part of the invention of one independent claim of the present invention may be made dependent on other independent claim.

What is claimed is:

1. An operational amplifier circuit which drives each of data lines of an electro-optical device, comprising:

scan lines;

data lines; and pixel electrodes which are specified by the scan lines and the data lines, an output of the operational amplifier circuit being set to a high impedance state in a given period including a transition between a first period in which a voltage level of a counter electrode becomes a first voltage level and a second period in which the voltage level of the counter electrode becomes a second voltage level, the counter electrode facing a pixel electrode with an electro-optical material interposed therebetween, the operational amplifier circuit including:

a first operational amplifier which drives a data line in the first period in which a voltage level of the counter electrode becomes the first voltage level;

a second operational amplifier which drives the data line in the second period in which a voltage level of the counter electrode becomes the second voltage level; and a clamp circuit which clamps an output of the operational amplifier circuit in a voltage range which is equal to or wider than a voltage range between a first power source VDD and a second vower source VSS of the operational amplifier circuit, and the clamp circuit including:

a first diode which sets the direction advancing from the output of the operational amplifier circuit to a third power source VDD' as the forward direction; and a second diode which sets the direction advancing from a fourth power source VSS' to the output of the operational amplifier circuit as the forward direction.

2. An operational amplifier circuit which drives each of data lines of an electro-optical device comprising:

scan lines;

data lines; and pixel electrodes which are specified by the scan lines and the data lines, an output of the operational amplifier circuit being set to a high impedance state in a given period including a transition between a first period in which a voltage level of a counter electrode becomes a first voltage level and a second period in which the voltage level of the counter electrode becomes a second voltage level, the counter electrode facing a pixel electrode with an electro-optical material interposed therebetween, a first operational amplifier of the operational amplifier circuit including:

a differential section; and an output section which has a first driving transistor of a first conductivity type having a gate electrode which is controlled based on an output of the differential section, a second operational amplifier of the operational amplifier circuit including:

a differential section; and an output section which has a second driving transistor of a second conductivity type having a gate electrode which is controlled based on an output of the differential section, the operational amplifier circuit including:

a clamps circuit which clamps an output of the operational amplifier circuit in a voltage range which is equal to or wider than a voltage range between a first power source VDD and a second power source VSS of the operational amplifier circuit, and the clamp circuit including:

a first diode which sets the direction advancing from the output of the operational amplifier circuit to a third power source VDD' as the forward direction; and a second diode which sets the direction advancing from a fourth power source VSS' to the output of the operational amplifier circuit as the forward direction.

3. The operational amplifier circuit as defined by claim 1, a voltage level of a data line connected to an output of the operational amplifier circuit being changed to a second power source side by setting an output of the operational amplifier circuit to the high impedance state and by using a capacitive coupling of a parasitic capacitance between the counter electrode and the data line, in a given period in which a voltage level of the counter electrode changes from a second voltage level of a first power source side to a first voltage level of a second power source side, and the voltage level of the data line connected to an output of the operational amplifier circuit being changed to a first power source side by setting an output of the operational amplifier circuit to the high impedance state and by using the capacitive coupling of the parasitic capacitance between the counter electrode and the data line, in a given period in which a voltage level of the counter electrode changes from a first voltage level of a second power source side to a second voltage level of a first power source side.

4. The operational amplifier circuit as defined by claim 3, comprising:

a first operational amplifier which changes the voltage level of the data line which has been changed to the second power source side to the first power source side, and sets the voltage level of the data line to a voltage level corresponding to a gray scale level; and a second operational amplifier which changes the voltage level of the data line which has been changed to the first power source side to the second power source side, and sets the voltage level of the data line to a voltage level corresponding to a gray scale level.

5. The operational amplifier circuit as defined by claim 1, a power source of the clamp circuit being set to the third and fourth power sources which have voltage ranges narrower than voltage ranges of the first and second power sources of the operational amplifier circuit.

6. The operational amplifier circuit as defined by claim 2, a power source of the clamp circuit being set to the third and fourth power sources which have voltage ranges narrower than voltage ranges of the first and second power sources of the operational amplifier circuit.

7. A driving circuit which drives an electro-optical device having scan lines, data lines and pixel electrodes which are specified by the scan lines and the data lines, the driving circuit comprising:

the operational amplifier circuit as defined by claim 1, which is provided for each of the data lines; and a data voltage generation circuit which is provided for each of the data lines and generates a data voltage which is impedance-converted by the operational amplifier circuit.

8. A driving circuit which drives an electro-optical device having scan lines, data lines and pixel electrodes which are specified by the scan lines and the data lines, the driving circuit comprising:

the operational amplifier circuit as defined by claim 2, which is provided for each of the data lines; and a data voltage generation circuit which is provided for each of the data lines and generates a data voltage which is impedance-converted by the operational amplifier circuit.

9. A driving circuit which drives an electro-optical device having scan lines, data lines and pixel electrodes which are specified by the scan lines and the data lines, the driving circuit comprising:

the operational amplifier circuit as defined by claim 3, which is provided for each of the data lines; and a data voltage generation circuit which is provided for each of the data lines and generates a data voltage which is impedance-converted by the operational amplifier circuit.

10. A driving circuit which drives an electro-optical device having scan lines, data lines and pixel electrodes which are specified by the scan lines and the data lines, the driving circuit comprising:

the operational amplifier circuit as defined by claim 5, which is provided for each of the data lines; and a data voltage generation circuit which is provided for each of the data lines and generates a data voltage which is impedance-converted by the operational amplifier circuit.

11. The operational amplifier circuit as defined by claim 1, the relationship $VDD > VDD' \geq VDD - VBD$, $VSS < VSS' \leq VSS + VBD$ being satisfied when the forward voltage of the first and second diodes is set to VBD.

12. The operational amplifier circuit as defined by claim 2, the relationship $VDD > VDD' \geq VDD - VBD$, $VSS < VSS' \leq VSS + VBD$ being satisfied when the forward voltage of the first and second diodes is set to VBD.

* * * * *